(12) United States Patent
Kawanabe

(10) Patent No.: US 9,508,678 B2
(45) Date of Patent: Nov. 29, 2016

(54) METHOD OF MANUFACTURING A SEMICONDUCTOR DEVICE INCLUDING APPLYING ULTRASONIC WAVES TO A BALL PORTION OF THE SEMICONDUCTOR DEVICE

(71) Applicant: Renesas Electronics Corporation, Kawasaki (JP)

(72) Inventor: Naoki Kawanabe, Kawasaki (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 14/602,186

(22) Filed: Jan. 21, 2015

(65) Prior Publication Data

US 2015/0228618 A1 Aug. 13, 2015

(30) Foreign Application Priority Data

Feb. 7, 2014 (JP) ................................ 2014-022742

(51) Int. Cl.
*H01L 21/44* (2006.01)
*H01L 23/00* (2006.01)

(52) U.S. Cl.
CPC ............. *H01L 24/85* (2013.01); *H01L 24/05* (2013.01); *H01L 24/97* (2013.01); *H01L 24/45* (2013.01); *H01L 24/78* (2013.01); *H01L 2224/02166* (2013.01); *H01L 2224/04042* (2013.01); *H01L 2224/05093* (2013.01); *H01L 2224/05124* (2013.01); *H01L 2224/05554* (2013.01); *H01L 2224/05557* (2013.01); *H01L 2224/32225* (2013.01); *H01L 2224/45139* (2013.01); *H01L 2224/45144* (2013.01); *H01L 2224/45147* (2013.01); *H01L 2224/45565* (2013.01); *H01L 2224/45664* (2013.01); *H01L 2224/4845* (2013.01); *H01L 2224/48091* (2013.01); *H01L 2224/48227* (2013.01); *H01L 2224/48228* (2013.01); *H01L 2224/48453* (2013.01); *H01L 2224/48465* (2013.01); *H01L 2224/49171* (2013.01); *H01L 2224/73265* (2013.01); *H01L 2224/78301* (2013.01); *H01L 2224/85181* (2013.01); *H01L 2224/85205* (2013.01);
(Continued)

(58) Field of Classification Search
CPC ............................... H01L 23/48; H01L 23/00
USPC ....................................................... 438/652
See application file for complete search history.

(56) References Cited

U.S. PATENT DOCUMENTS 6,197,615 B1* 3/2001 Song ................ H01L 23/49503
257/E23.037
6,388,336 B1* 5/2002 Venkateshwaran . H01L 23/4951
257/666

(Continued)

FOREIGN PATENT DOCUMENTS

JP 2003-243443 A 8/2003

*Primary Examiner* — Caleb Henry
(74) *Attorney, Agent, or Firm* — McGinn IP Law Group, PLLC

(57) ABSTRACT

A method of manufacturing a semiconductor device which improves the reliability of a semiconductor device. The method of manufacturing the semiconductor device includes the step of connecting a ball portion formed at the tip of a wire with a pad (electrode pad) of a semiconductor chip. The pad is comprised of an aluminum-based material and has a trench in its portion to be connected with the ball portion. The ball portion is comprised of a harder material than gold. The step of connecting the ball portion includes the step of applying ultrasonic waves to the ball portion.

25 Claims, 32 Drawing Sheets

(52) U.S. Cl.
CPC ............... *H01L2224/85206* (2013.01); *H01L 2224/85345* (2013.01); *H01L 2224/85365* (2013.01); *H01L 2224/92247* (2013.01); *H01L 2924/13091* (2013.01); *H01L 2924/15311* (2013.01); *H01L 2924/181* (2013.01)

(56) References Cited

U.S. PATENT DOCUMENTS

| | | | | |
|---|---|---|---|---|
| 8,569,163 B2 * | 10/2013 | Sekihara | ............. | H01L 23/3114 257/784 |
| 8,581,407 B2 * | 11/2013 | Salmon | ............. | H01L 23/49811 257/734 |
| 8,643,159 B2 * | 2/2014 | Wong | ............... | H01L 23/49548 257/676 |
| 8,853,865 B2 * | 10/2014 | Narita | ................ | H01L 21/4821 257/778 |
| 8,946,705 B2 * | 2/2015 | Yasumura | ............... | H01L 24/05 257/48 |
| 8,987,063 B2 * | 3/2015 | Harata | .............. | H01L 23/49503 257/666 |
| 2003/0151149 A1 * | 8/2003 | Ichikawa | ................ | H01L 24/05 257/784 |
| 2008/0135997 A1 * | 6/2008 | Lee | ......................... | H01L 23/13 257/676 |
| 2008/0286959 A1 * | 11/2008 | Chia | ................... | H01L 23/4952 438/617 |
| 2010/0065963 A1 * | 3/2010 | Eldridge | .............. | B23K 20/004 257/734 |
| 2010/0258955 A1 * | 10/2010 | Miyagawa | .............. | H01L 24/85 257/784 |
| 2010/0276802 A1 * | 11/2010 | Shirahama | .............. | H01L 24/48 257/738 |
| 2011/0057299 A1 * | 3/2011 | Takata | ................. | B23K 20/007 257/676 |
| 2012/0001336 A1 * | 1/2012 | Zeng | ...................... | H01L 24/05 257/769 |
| 2012/0164795 A1 * | 6/2012 | Sekihara | ............ | H01L 23/3114 438/123 |
| 2013/0264693 A1 * | 10/2013 | Wong | ................ | H01L 23/49548 257/676 |
| 2014/0353822 A1 * | 12/2014 | Oyachi | ............ | H01L 23/49811 257/737 |
| 2014/0374467 A1 * | 12/2014 | Yap | ........................ | H01L 24/85 228/180.5 |
| 2015/0187729 A1 * | 7/2015 | Chew | ...................... | H01L 24/85 257/784 |

* cited by examiner

METHOD OF MANUFACTURING A SEMICONDUCTOR DEVICE INCLUDING APPLYING ULTRASONIC WAVES TO A BALL PORTION OF THE SEMICONDUCTOR DEVICE

CROSS-REFERENCE TO RELATED APPLICATIONS

The disclosure of Japanese Patent Application No. 2014-022742 filed on Feb. 7, 2014 including the specification, drawings and abstract is incorporated herein by reference in its entirety.

BACKGROUND

The present invention relates to semiconductor devices and methods of manufacturing the semiconductor devices thereof and more particularly to technology for semiconductor devices in which metal wires are connected with the electrode pads of a semiconductor chip.

Japanese Unexamined Patent Application Publication No. 2003-243443 describes a semiconductor device in which the ball portion of a metal wire is connected with a bonding pad including a plurality of recesses.

SUMMARY

One method of electrically connecting an electrode pad formed on a semiconductor chip with a terminal of a substrate over which the semiconductor chip is mounted is a wire bonding process in which a portion of a metal wire is connected with the electrode pad and another portion of the wire is connected with the terminal. In the wire bonding process, when connecting the wire with the electrode pad, the tip of the wire is pre-shaped into a ball and the ball portion is pressed so as to contact the electrode pad.

For connection between the ball portion and the electrode pad, there is a technique in which ultrasonic waves are applied to the ball portion. However, when the ball portion is connected with an electrode pad comprised of an aluminum-based material, this technique has been found to pose the following problem: as ultrasonic waves are applied, flaking from the electrode pad (partial peel-off of the electrode) occurs around the joint between the ball portion and electrode.

The above and further objects and novel features of the invention will more fully appear from the following detailed description in this specification and the accompanying drawings.

According to one aspect of the present invention, there is provided a method of manufacturing of a semiconductor device which includes the step of connecting the ball portion formed at the tip of a wire with a first electrode pad of a semiconductor chip. The first electrode pad is comprised of an aluminum-based material and has a trench in its portion to be connected with the ball portion. The ball portion is comprised of a harder material than gold. The step of connecting the ball portion includes the step of applying ultrasonic waves to the ball portion.

According to the above aspect of the present invention, the reliability of a semiconductor device is improved.

DETAILED DESCRIPTION

Rules of Description in the Specification

Figure 1:
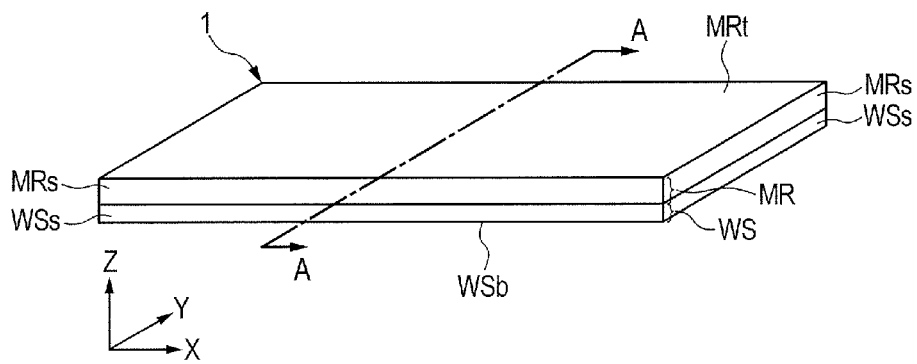
FIG. 1 is a perspective view of a semiconductor device according to an embodiment of the present invention.

The preferred embodiments of the present invention may be described separately in different sections as necessary or for convenience sake, but the embodiments described as such are not irrelevant to each other unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, when a specific numerical value is indicated for an element, the numerical value is not essential for the element unless otherwise expressly stated or unless theoretically limited to the numerical value or unless obviously the context requires the element to be limited to the specific value.

In description of a material or composition in an embodiment of the invention, the expression "X which comprises (or includes) A" does not exclude a material or composition which includes an element other than A unless otherwise expressly stated or unless obviously the context requires exclusion of another element. If the expression concerns a component, it means "X which contains A as a main component". For example, obviously the term "silicon member" refers to not only a member made of pure silicon but also a member made of SiGe (silicon germanium) alloy or another type of multi-component alloy which contains silicon as a main component or a silicon-based member which contains another additive. Similarly, for example, the terms "gold plating," "Cu layer," and "nickel plating" obviously refer to not only members of pure gold, Cu and nickel respectively but also members made of multi-component material which contains gold, Cu and nickel as main components respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires it to be limited to the specific value or quantity.

In all the drawings that illustrate the preferred embodiments, the same or similar elements are designated by the same or similar reference signs or numerals and basically descriptions thereof are not repeated.

Regarding the accompanying drawings, hatching or the like may be omitted even in a cross section diagram if hatching may cause the diagram to look complicated or it is easy to distinguish the area concerned from an air gap. In connection with this, background contour lines may be omitted even for a closed hole in plan view if the contour of the hole is apparent from an explanation, etc. Furthermore, even if a drawing does not show a cross section, hatching or a dot pattern may be added to clarify that the area concerned is not an air gap or to show the border of an area clearly.

Although the technique described below can be applied to a wide range of semiconductor devices in which a metal wire is connected with an electrode pad formed on a semiconductor chip surface, this embodiment concerns an example of the technique applied to an area array semiconductor device which uses a wiring substrate as a substrate over which a semiconductor chip is mounted. An area array semiconductor device is a semiconductor device in which external terminals are arranged in an array (or matrix) pattern on a mounting surface. As the area array semiconductor device according to this embodiment, a so-called BGA (Ball Grid Array) semiconductor device will be taken as an example and described, in which a solder ball is connected with each of external terminals arranged on the mounting surface of the wiring substrate.

Figure 2:
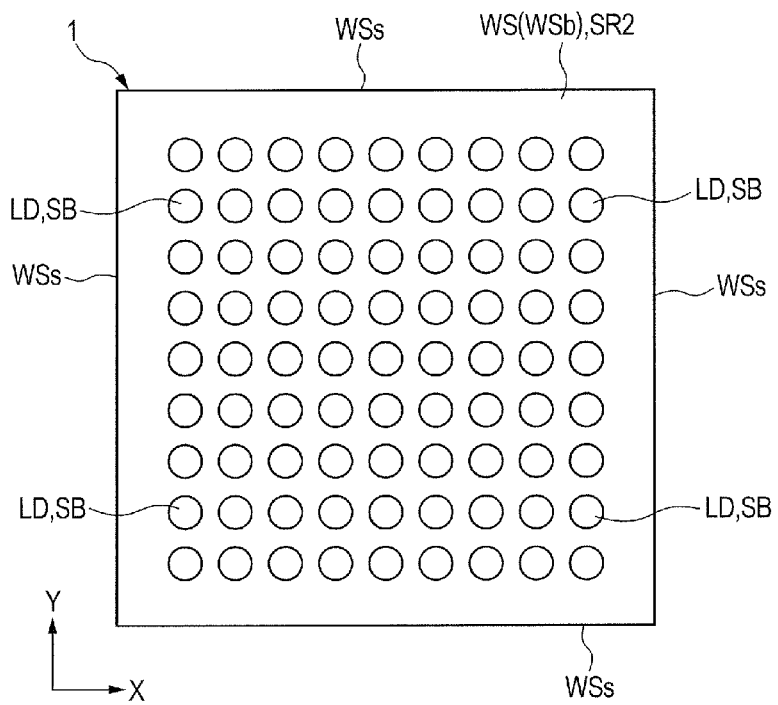
FIG. 2 is a bottom view of the semiconductor device shown in FIG. 1.
Figure 3:
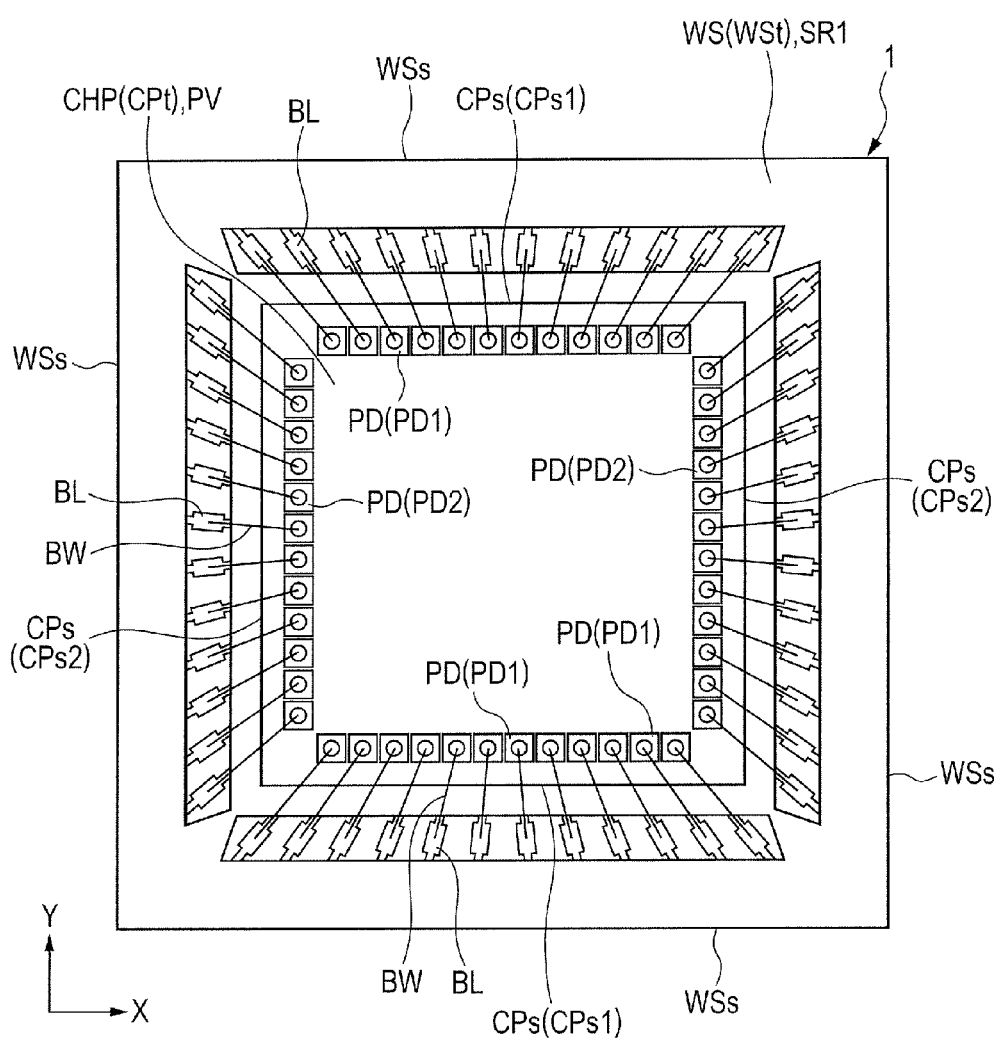
FIG. 3 is a transparent plan view showing the structure of a wiring substrate with a sealing body (shown in FIG. 1) removed.
Figure 4:
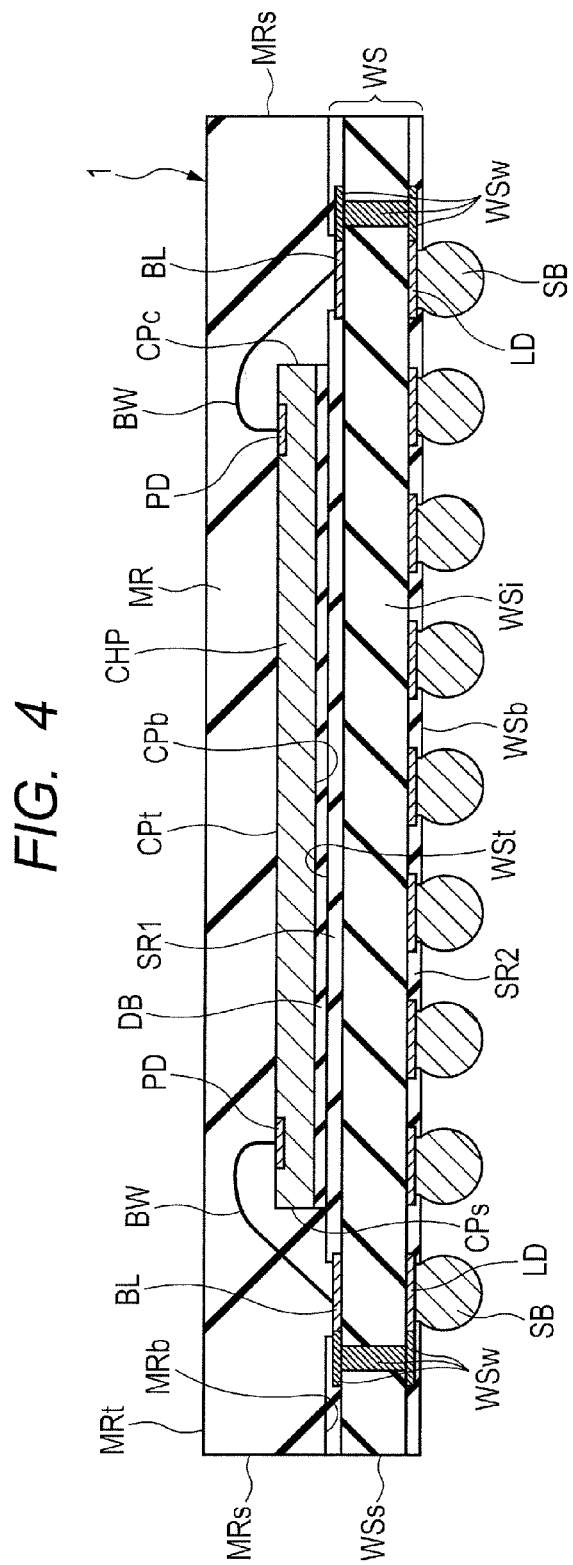
FIG. 4 is a sectional view taken along the line A-A of FIG. 1.

FIG. 1 is a perspective view of the semiconductor device according to this embodiment and FIG. 2 is a bottom view of the semiconductor device shown in FIG. 1. FIG. 3 is a transparent plan view showing the structure of the wiring substrate with a sealing body (FIG. 1) removed. FIG. 4 is a sectional view taken along the line A-A of FIG. 1.

Semiconductor Device

First, the general structure of the semiconductor device 1 according to this embodiment will be described referring to FIGS. 1 to 4. The semiconductor device 1 according to this embodiment has a semiconductor chip CHP (see FIGS. 3 and 4) and a wiring substrate WS over which the semiconductor chip CHP is mounted. As shown in FIG. 4, the semiconductor chip CHP is mounted over the upper surface WSt (first surface, chip mounting surface) of the wiring substrate WS and covered by a sealing body (resin) MR.

The sealing body MR includes an upper surface MRt, a lower surface MRb opposite to the upper surface MTt (FIG. 4), and side surfaces MRs located between the upper surface MTt and lower surface MRb and is quadrangular in plan view. In the example shown in FIG. 1, the plane area of the sealing body MR (area of the upper surface MRt in plan view) is the same as the plane area of the wiring substrate WS and the side surfaces MRs of the sealing body MR are continuous with the side surfaces WSs of the wiring substrate WS. The wiring substrate WS and sealing body MR are quadrangular in plan view.

As shown in FIGS. 3 and 4, the semiconductor chip CHP mounted over the wiring substrate WS includes a front surface (main surface, upper surface) CPt, a back surface (main surface, lower surface) CPb (FIG. 4) opposite to the front surface CPt and side surfaces CPs (FIG. 4) located between the front surface CPt and back surface CPb.

As shown in FIG. 3, the semiconductor chip CHP is quadrangular in plan view. The front surface CPt of the semiconductor chip CHP has sides CPs1 extending along the X direction (a pair of sides CPs1 facing to each other) and sides CPs2 extending along the Y axis perpendicular to the X direction (a pair of sides CPs2 facing to each other). As shown in FIG. 4, the semiconductor chip CHP is mounted over the wiring substrate WS so that its sides extend along the sides of the wiring substrate WS which constitute the outer edges of the upper surface WSt.

On the front surface CPt of the semiconductor chip CHP, a plurality of pads (electrode pads) PD are arranged along the sides of the front surface CPt. The pads PD are input/output terminals of the semiconductor chip CHP and exposed from openings in the protective film PV (passivation film) including the front surface CPt of the semiconductor chip CHP. The pads PD include a plurality of pads PD1 arranged along sides CPs1 (in other words, arranged along the X direction) and a plurality of pads PD2 arranged along sides CPs2 (in other words, arranged along the Y direction). For example, each of the pads PD is mainly comprised of aluminum (Al). The structure of the semiconductor chip CHP will be described in detail later.

As shown in FIGS. 3 and 4, the semiconductor chip CHP is mounted over the upper surface WSt of the wiring substrate WS. In the example shown in FIG. 3, the semiconductor chip CHP is placed in the center of the upper surface WSt of the wiring substrate WS. As shown in FIG. 4, the semiconductor chip CHP is mounted over the wiring substrate WS through die bond (adhesive) DB with the back surface CPb facing the upper surface WSt of the wiring substrate WS. In other words, the so-called face-up mounting method is employed in which the surface (back surface CPb) opposite to the front surface CPt (main surface) bearing the pads PD, faces to the chip mounting surface (upper surface WSt).

The die bond DB is an adhesive which bonds and fixes the semiconductor chip CHP to the wiring substrate WS. For example, by hardening a paste adhesive, the semiconductor chip CHP and the wiring substrate WS are bonded and fixed together. However, the die bond DB is not limited to the above and resin film called DAF (Die Attach Film) may be used instead. The adhesive used as the die bond DB is often made of an epoxy resin-based material, whether it is DAF or paste adhesive.

As shown in FIG. 4, the wiring substrate WS has the upper surface (surface, chip mounting surface) WSt over which the semiconductor chip CHP is mounted, the lower surface (surface, mounting surface) WSb opposite to the upper surface WSt, and the plural side surfaces WSs between the upper surface WSt and lower surface WSb and as shown in FIGS. 2 and 3, it is quadrangular in plan view.

The wiring substrate WS has a plurality of wiring layers (in the example shown in FIG. 4, two layers, an upper wiring layer and a lower wiring layer). An insulating layer WSi between the wiring layers is made of, for example, glass fiber or prepreg (resin-impregnated carbon fiber). A plurality of bonding leads BL are formed on the upper side of the insulating layer WSi and a plurality of lands LD are formed on the lower side of the insulating layer WSi and the bonding leads BL and lands LD are electrically connected through a plurality of wirings WSw.

As shown in FIG. 3, a plurality of bonding leads (terminals, chip mounting surface side terminals, electrodes) BL are formed on the upper surface WSt of the wiring substrate WS. The bonding leads BL are arranged along the sides of the semiconductor chip CHP around the chip mounting region in which the semiconductor chip CHP is mounted. More specifically, a solder resist film (insulating film) SR1 to cover the wirings formed on the upper surface of the insulating layer WSi is formed on the upper surface WSt of the wiring substrate WS and the bonding leads BL are exposed from the solder resist film SR1 in openings formed in the solder resist film SR1.

The pads PD of the semiconductor chip CHP and the bonding leads BL of the wiring substrate WS are electrically connected through a plurality of wires (conductive members) BW. The material of the wires BW is often a gold (Au)-based or copper (Cu)-based metal. In this embodiment, the wires are made of, for example, a copper-based metal. The wires BW will be explained in detail later.

As shown in FIG. 2, a plurality of lands (external terminals, electrode pads, external electrode pads) LD are formed on the lower surface WSb of the wiring substrate WS. The lands LD are arranged in a matrix pattern. As shown in FIG. 4, the lands LD are electrically connected with the bonding leads BL through the wires WSw formed in the wiring substrate WS. The lands LD are each electrically connected with the semiconductor chip CHP and serve as external terminals which connect the semiconductor chip CHP with an external device.

A semiconductor device in which external terminals are arranged in a matrix pattern on the mounting surface of a wiring substrate as mentioned above is called an area array semiconductor device. An area array semiconductor device is advantageous in the sense that the mounting surface (lower surface WSb) of the wiring substrate WS can be effectively used as space for external terminals and even when the number of external terminals increases, increase in the mounting area of the semiconductor device can be avoided. In other words, even when the number of external terminals is increased to achieve higher functionality and higher integration, the semiconductor device can be compact.

As for the number and arrangement of external terminals, those shown in FIG. 2 may be modified in a variety of ways. FIG. 4 shows, as an example, a wiring substrate WS in which a wiring layer is formed on each of the upper and lower surfaces of the insulating layer WSi. However, the number of wiring layers is not limited thereto and the wiring layer structure may include more than two wiring layers.

The bonding leads BL, lands LD, and wirings WSw which make up conductive paths of the wiring substrate WS are formed by patterning a metal film and for example, the metal film may be a copper (Cu)-based conductive film. Among the wirings WSw, the wirings WSw which make the upper and lower surfaces of the insulating layer WSi conductive with each other are formed, for example, by burying metal film in through holes and for example, the metal film may be a copper (Cu)-based conductive film. The copper-based conductive film here includes film containing only copper, copper alloy film, and laminate film with film of other metal (for example, nickel) stacked over copper film. The type of conductive film used here may be selected according to the required specification of the wiring substrate WS.

The lands LD are each exposed from a solder resist film (insulating film) SR2 which covers the lower surface WSb of the wiring substrate WS. More specifically, the solder resist film (insulating film) SR2 which covers the wirings formed on the lower surface of the insulating layer (core insulating layer) is formed on the lower surface WSb of the wiring substrate WS and the lands LD are each exposed from the solder resist film SR2 in a plurality of openings formed in the solder resist film SR2.

In this embodiment, a solder ball SB as a ball-shaped solder member is connected with the exposed surface of each of the lands LD. When the semiconductor device 1 is mounted over a mounting substrate (not shown), solder is often used as a conductive bond to connect terminals of the mounting substrate and the semiconductor device 1 electrically. Therefore, the presence of solder balls SB on the exposed surfaces of the lands LD from the solder resist film SR2 improves the wettability to solder in mounting the semiconductor device 1 over the mounting substrate (not shown).

The solder balls SB are made of lead-free solder which contains virtually no lead: for example, the solder ball material contains only tin (Sn) or it is tin-bismuth (Sn—Bi) or tin-silver-copper (Sn—Ag—Cu). Here, lead-free solder is defined as a solder which does not contain more than 0.1 wt % lead (Pb), in accordance with the RoHs (Restriction of Hazardous Substances) Directive. In the present invention, the term "solder" means lead-free solder unless otherwise specified.

The means to improve the wettability to the solder used in mounting is not limited to such solder balls SB; instead, a film of metal with higher wettability to solder than copper, such as a nickel film, may be formed in a way to cover the exposed surfaces of the lands LD by a plating process. If it is not necessary to pay special attention to solder wettability, the exposed surfaces of the lands LD need not always be covered by a solder material. A modified form of semiconductor device in which the lands LD are exposed without solder balls SB as shown in FIG. 4 or a modified form of semiconductor device in which a solder film or another type of metal film is formed to cover the exposed surfaces of the lands LD is called an LGA (Land Grid Array) semiconductor device.

Semiconductor Chip

Figure 5:
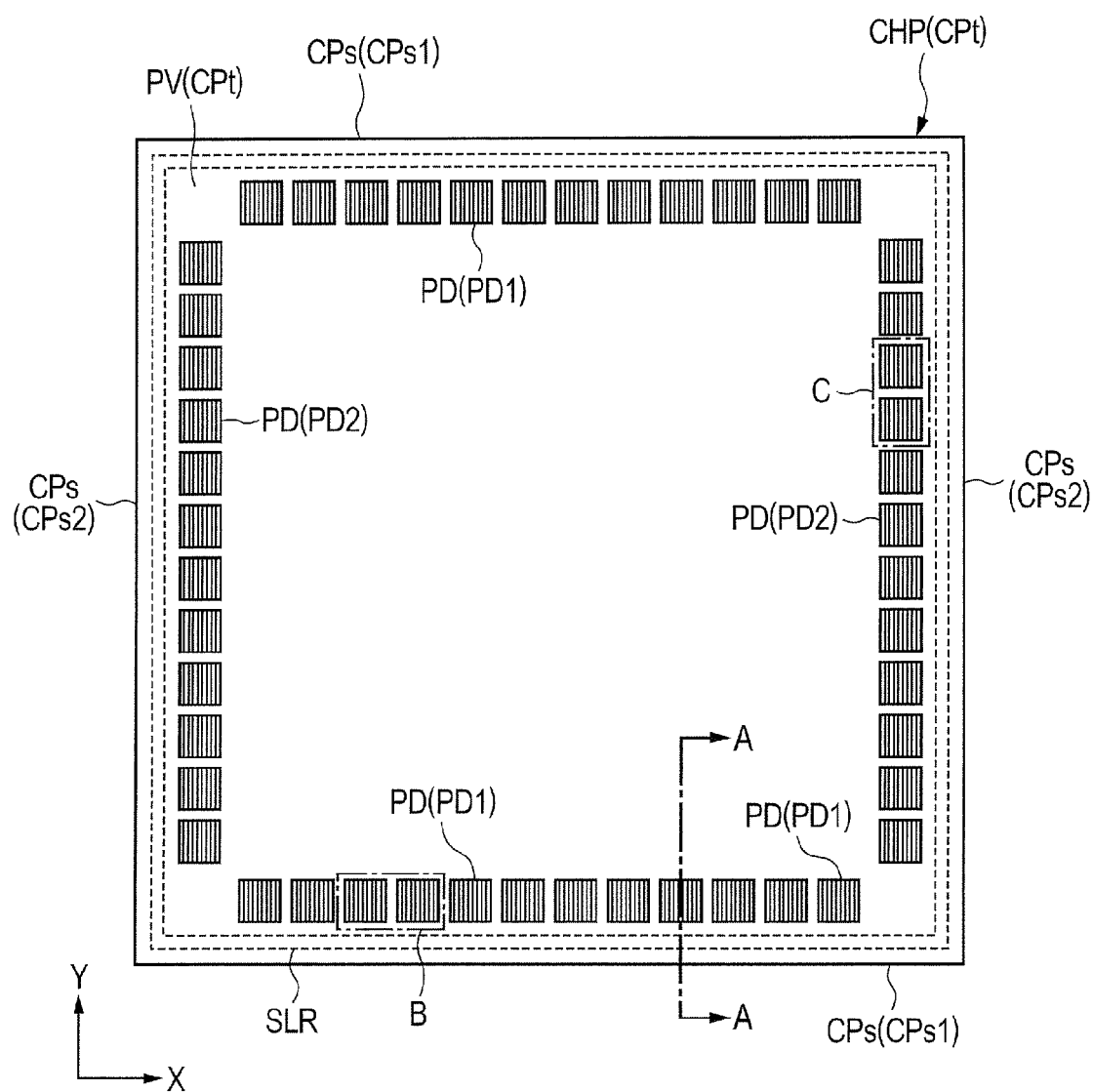
FIG. 5 is a plan view of a semiconductor chip shown in FIG. 3.
Figure 6:
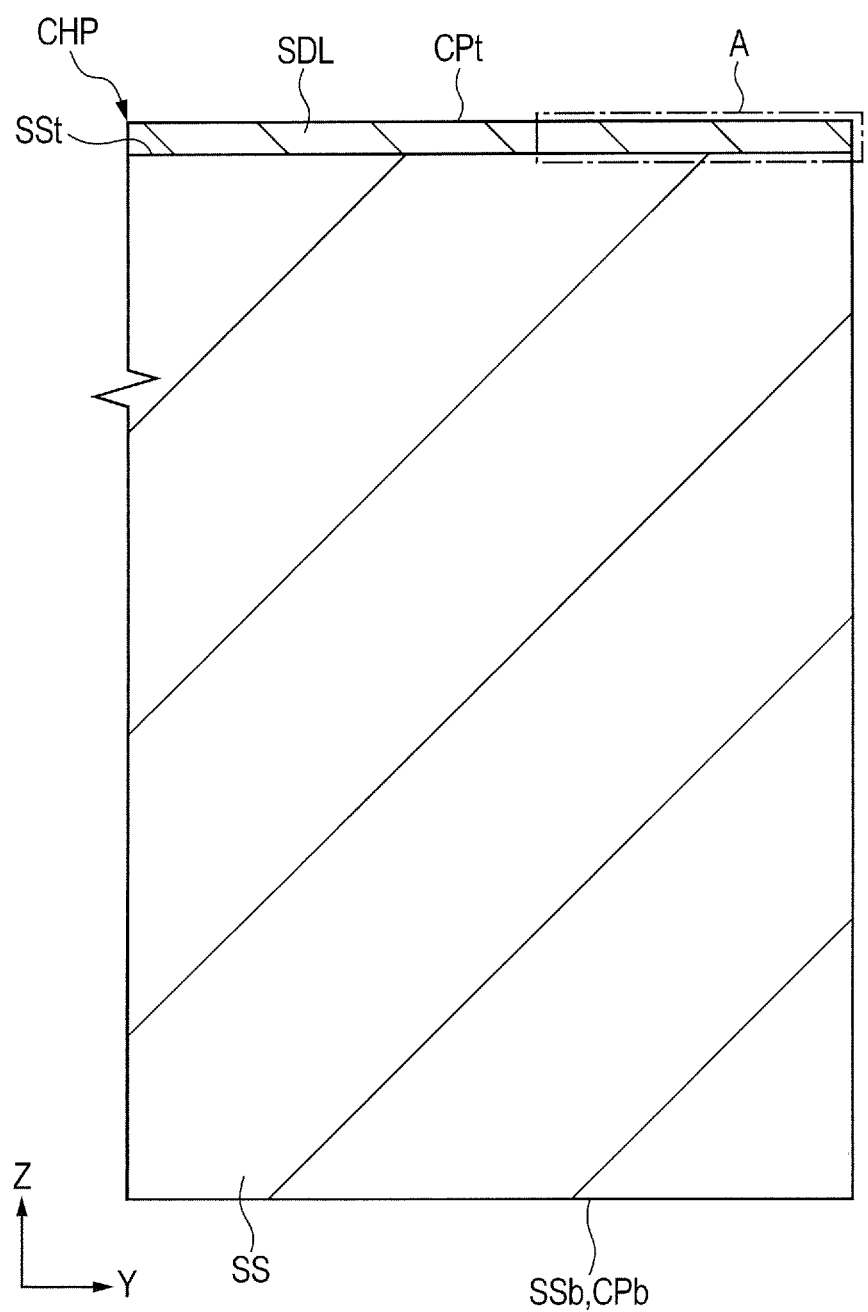
FIG. 6 is an enlarged sectional view taken along the line A-A of FIG. 5.
Figure 7:
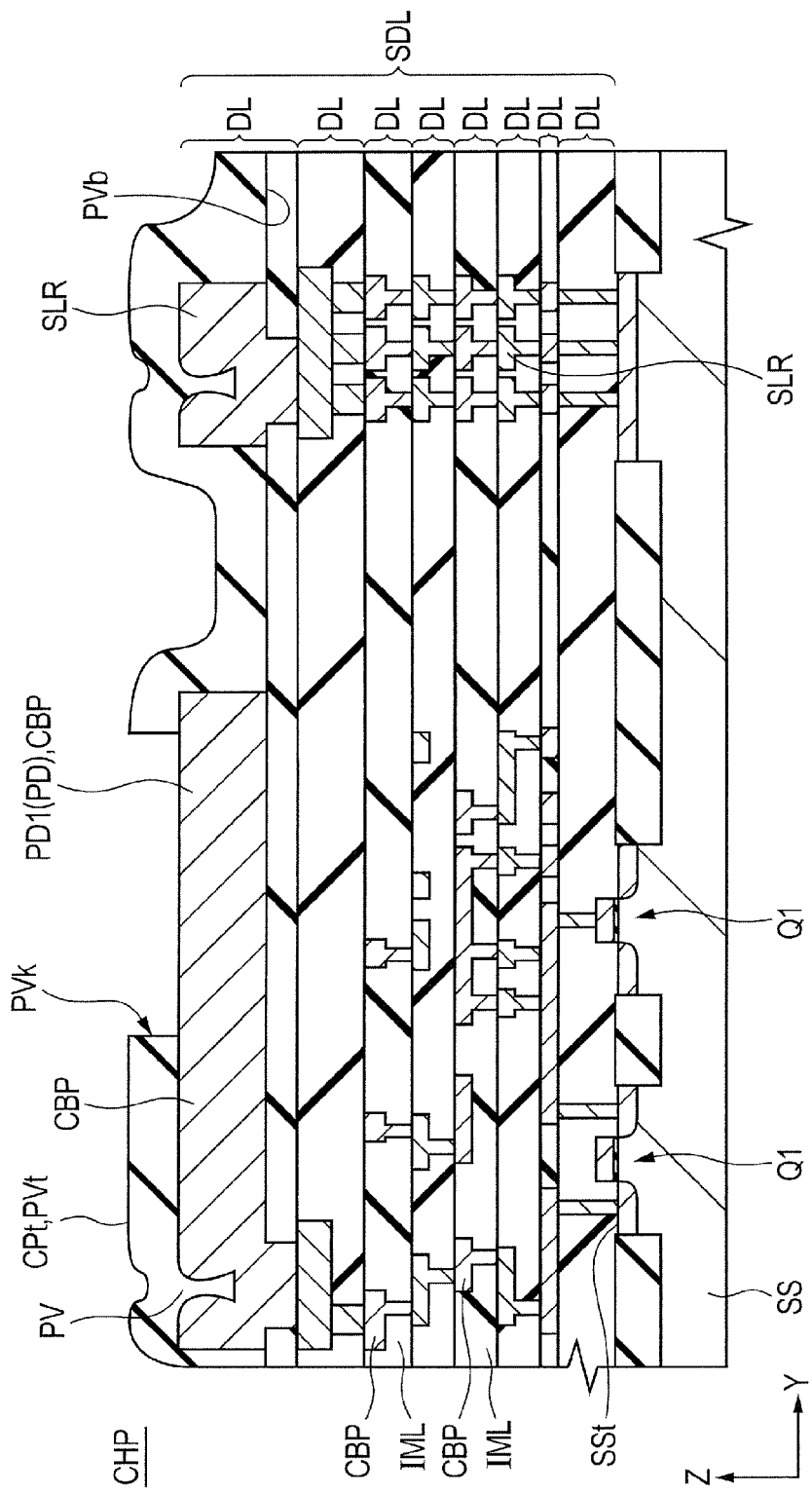
FIG. 7 is a further enlarged sectional view of part A of FIG. 6.

Next, the semiconductor chip shown in FIGS. 3 and 4 will be described. FIG. 5 is a plan view of the semiconductor chip shown in FIG. 3. FIG. 6 is an enlarged sectional view taken along the line A-A of FIG. 5. FIG. 7 is a further enlarged sectional view of part A of FIG. 6.

For easy understanding, FIGS. 5 to 7 show the semiconductor chip before the wires BW are connected with the pads PD shown in FIG. 3. FIG. 7 shows an example of a wiring section SDL in which eight wiring layers DL, including a wiring layer DL with pads PD formed therein, are stacked. The number of wiring layers is not limited to eight but it may be seven or less or nine or more. In the example shown in FIG. 7, a plurality of semiconductor elements Q1 formed over the upper surface SSt of a semiconductor substrate SS each have a MOSFET (Metal Oxide Semiconductor Field Effect Transistor) structure. However, the structure of the semiconductor elements Q1 may be any of various structures other than the MOSFET structure.

The semiconductor chip CHP in this embodiment has a semiconductor substrate SS which includes an upper surface (semiconductor element formation surface) SSt where a plurality of semiconductor elements Q1 (FIG. 7) are formed, and a lower surface (back surface) SSb opposite to the upper surface SSt. The semiconductor substrate SS is the base of the semiconductor chip CHP and is mainly made of silicon (Si). The semiconductor chip CHP has a wiring section SDL (FIGS. 6 and 7) formed over the upper surface SSt of the semiconductor substrate SS.

In the example shown in FIG. 6, the lower surface (back surface) CPb of the semiconductor chip CHP is flush with the lower surface SSb of the semiconductor substrate SS. The front surface (main surface, upper surface) CPt of the semiconductor chip CHP includes the upper surface PVt of a protective film PV (FIGS. 5 and 7) formed to cover the uppermost layer of the wiring section SDL, and exposed surfaces from the protective film PV for the pads PD (FIGS. 5 and 7).

The wiring section SDL includes a plurality of wiring layers DL stacked as shown in FIG. 7 in enlarged form. In the wiring section SDL, a plurality of semiconductor elements Q1 and a plurality of pads PD are electrically connected through a plurality of stacked wiring layers DL. The pads PD are formed in the uppermost layer (layer remotest from the upper surface SSt of the semiconductor substrate SS) among the wiring layers DL of the wiring section SDL.

Each of the wiring layers DL has an insulating layer IML stacked over the semiconductor substrate SS and a plurality of conductor patterns (wirings) CBP buried in openings formed in the insulating layer IML. In the wiring section SDL, the conductor patterns CBP formed in the wiring layers DL are electrically connected to make up conductive paths which connect the semiconductor elements Q1 and pads PD electrically.

The materials of the wiring layers DL are listed below as examples, though they are not limited to these materials. The material of the insulating layers IML may be mainly made of a silicon oxide ($SiO_2$). The conductor patterns CBP may be mainly made of copper (Cu). The uppermost wiring layer DL may be mainly comprised of the same metal as the pads PD, for example, aluminum.

The uppermost wiring layer DL including the pads PD is covered by a protective film (passivation film, insulating film) PV including the front surface CPt of the semiconductor chip CHP. Since the protective film PV covers the wiring section SDL, the wiring section SDL is protected. The protective film PV, which covers the wiring section SDL, has a lower surface (surface) PVb facing to the upper surface SSt of the semiconductor substrate SS and an upper surface (surface) PVt opposite to the lower surface PVb.

As shown in FIG. 7, since the protective film PV is a film which covers the wiring section SDL, the wiring section SDL, including stacked wiring layers DL, lies between the lower surface PVb of the protective film PV and the upper surface SST of the semiconductor substrate SS. The lower surface PVb of the protective film PV is in close contact with the uppermost wiring layer DL among the wiring layers DL.

The protective film PV is made of silicon oxide ($SiO_2$), silicon nitride (SiN) or silicon oxynitride (SiON) or a laminate of these materials. In some cases, a resin film such as a polyimide film is made to cover the film of silicon oxide, silicon nitride or silicon oxynitride. Although FIG. 5 shows an example that the protective film PV is simply a single-layer insulating film, instead the protective film PV may be a laminate film. If the protective film PV is a laminate film, the insulating film lower surface of the lowermost layer (layer nearest to the wiring layers DL) corresponds to the lower surface PVb of the protective film PV. If the protective film PV is a laminate film, the insulating film upper surface of the uppermost layer (layer remotest from the wiring layers DL) corresponds to the upper surface PVt of the protective film PV.

The pads PD of the semiconductor chip CHP are formed between the protective film PV and the semiconductor substrate SS as shown in FIG. 7, and they are exposed from the protective film PV on the front surface CPt of the semiconductor chip CHP as shown in FIG. 3. Specifically, as shown in FIG. 7, the protective film PV has an opening PVk in an area which overlaps the thickness direction (Z direction in FIG. 7) of each pad PD. The opening PVk is formed to penetrate the protective film PV from either of the upper surface PVt and the lower surface PVb to the other surface. Therefore, the pads PD are exposed from the protective film PV in the areas which overlap the openings PVk made in the protective film PV. Consequently, a conductive member such as the wire BW shown in FIG. 3 can be connected with each of the pads PD. In other words, the pads PD can be used as external terminals of the semiconductor chip CHP.

Also, as shown in FIG. 5, a seal ring (metal pattern) SLR extends between the pads PD and the sides of the semiconductor chip CHP as its outer edges along the sides in plan view. In plan view, the seal ring SLR is formed along the periphery of the semiconductor chip CHP and the pads PD are formed inside the region surrounded by the seal ring SLR. As shown in FIG. 7, the seal ring SLR is a metal pattern made of the same material as the conductor patterns CBP made in the wiring layers DL of the wiring section SDL. It is formed in a way to penetrate the wiring layers DL from the wiring layer DL in the same layer as the pads PD to the upper surface SSt of the semiconductor substrate SS.

Electrode Pad

Figure 8:
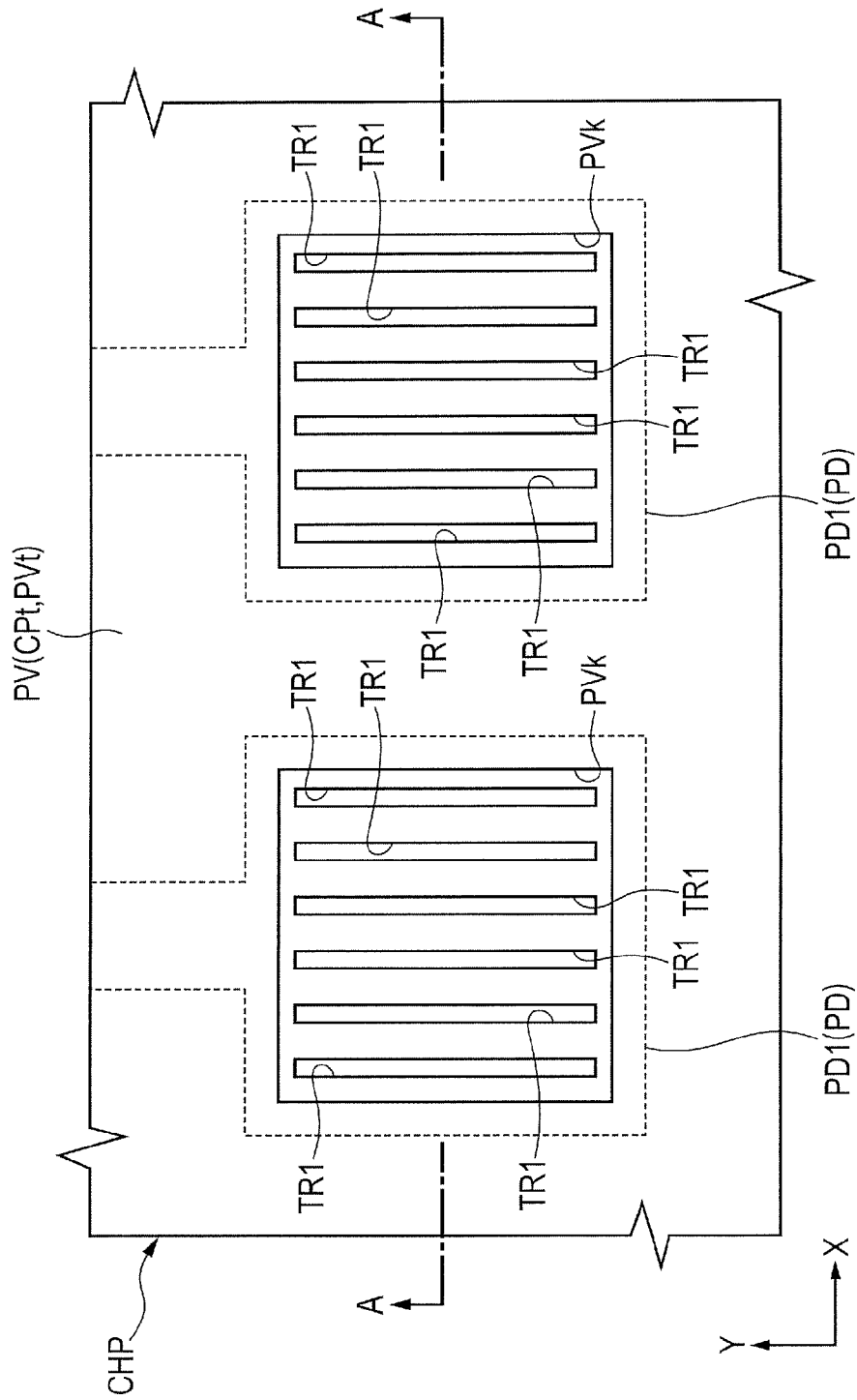
FIG. 8 is an enlarged plan view of part B of FIG. 5.
Figure 9:
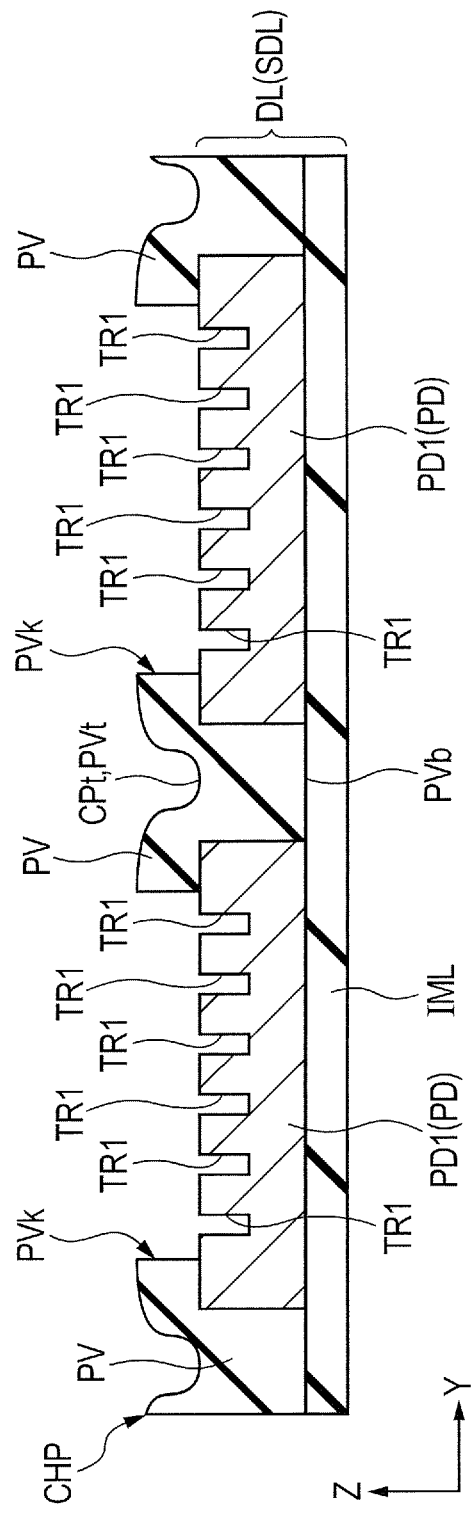
FIG. 9 is an enlarged sectional view taken along the line A-A of FIG. 8.
Figure 10:
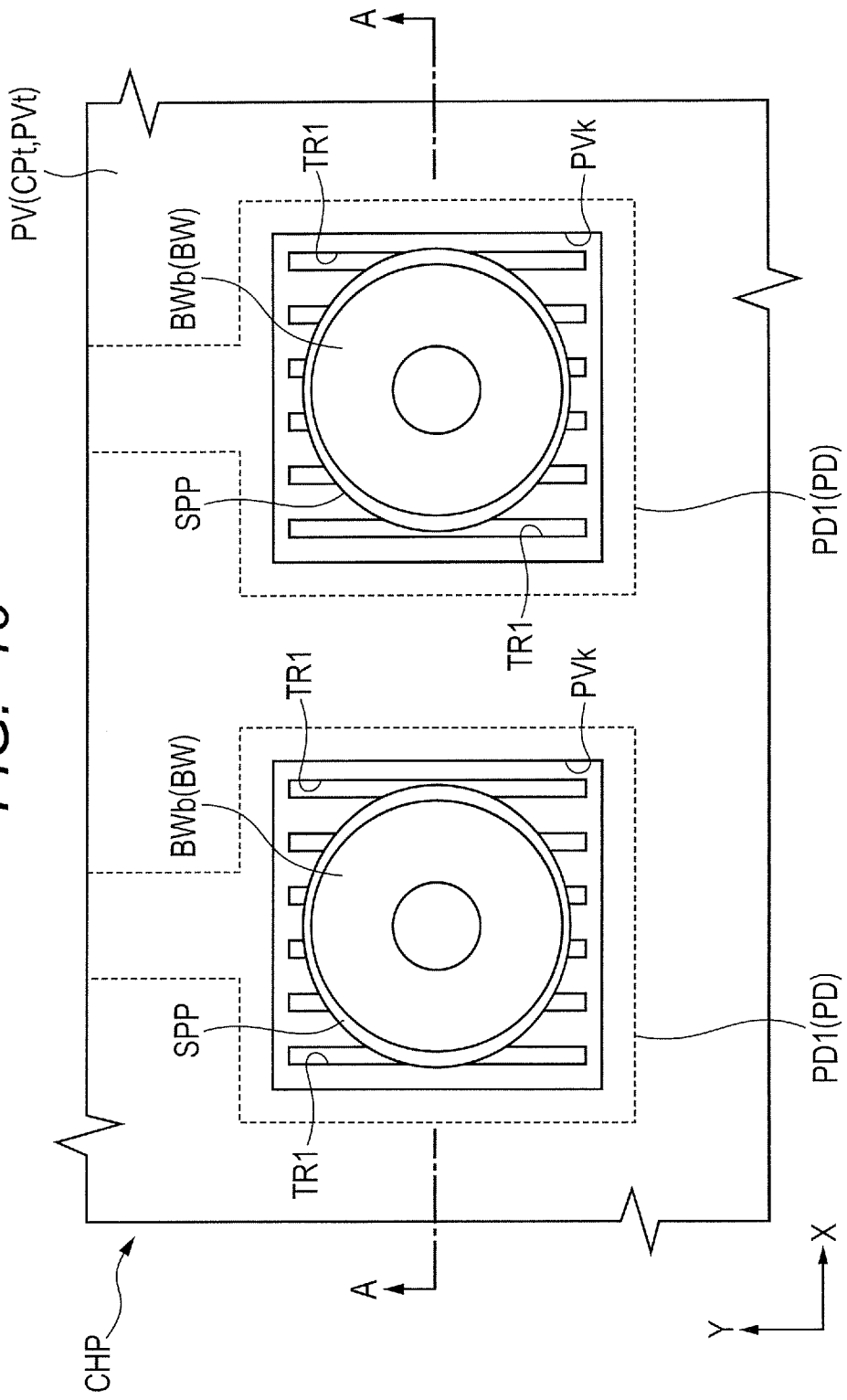
FIG. 10 is an enlarged plan view showing electrode pads (shown in FIG. 8) to which wires (shown in FIG. 3) are bonded.
Figure 11:
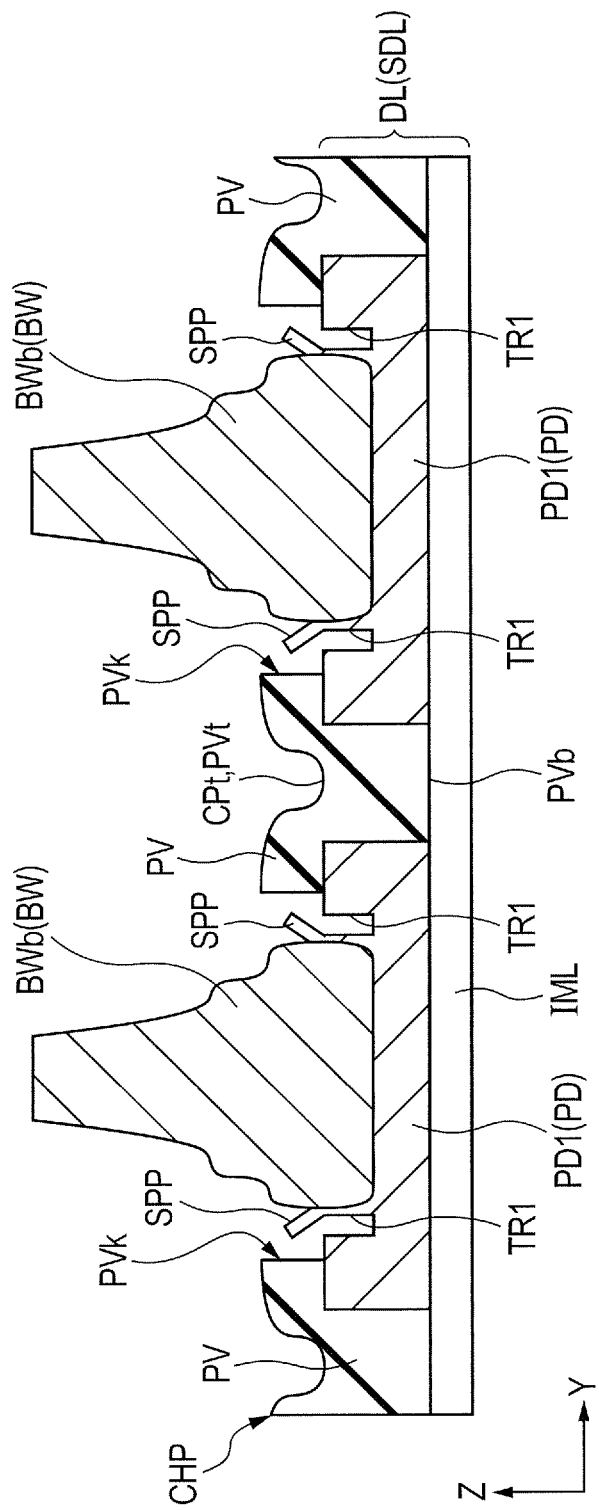
FIG. 11 is an enlarged sectional view taken along the line A-A of FIG. 10.
Figure 12:
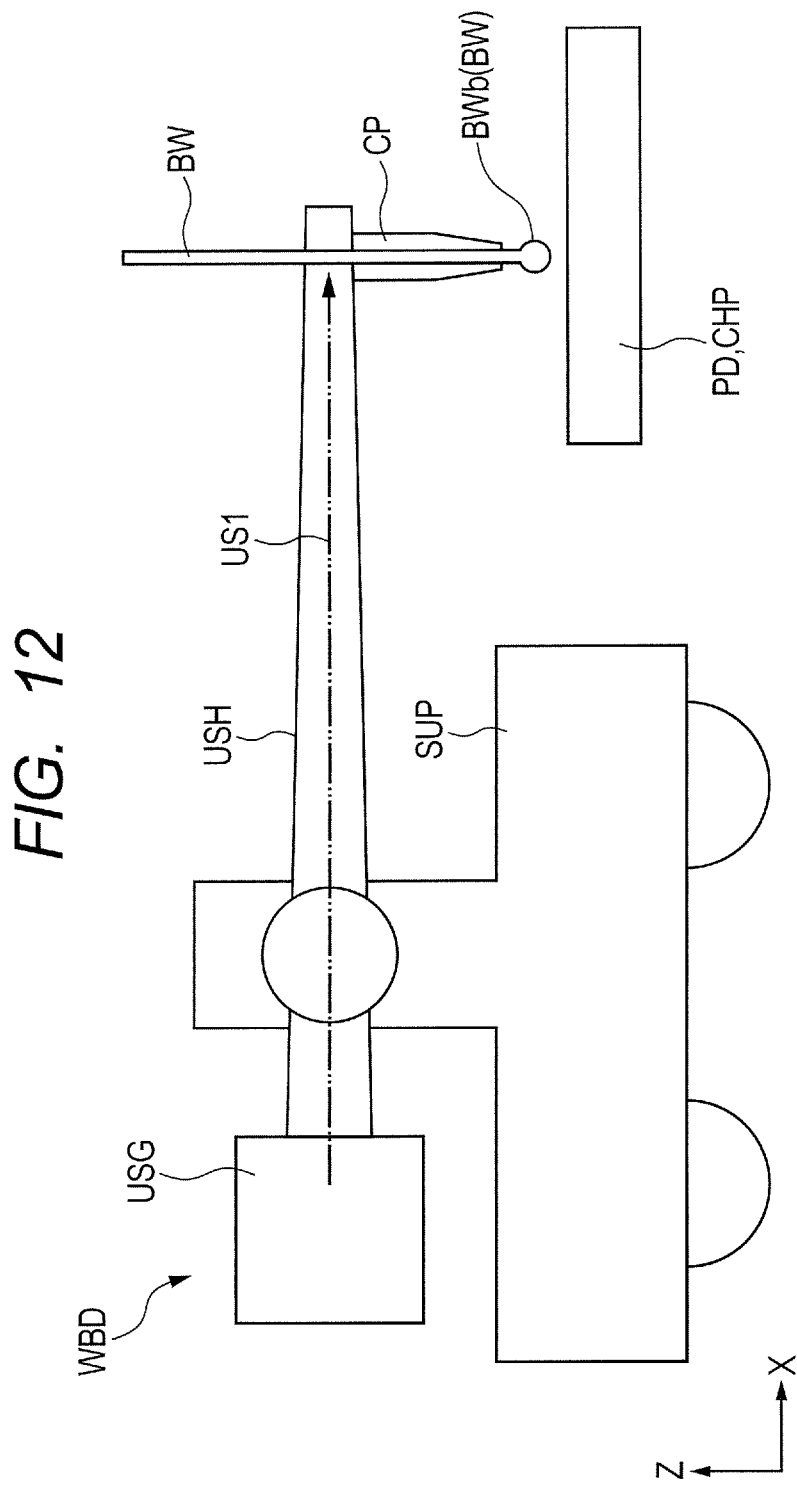
FIG. 12 is an explanatory view which schematically shows the wire bonding apparatus used in bonding the wires to the pads as shown in FIGS. 10 and 11.
Figure 34:
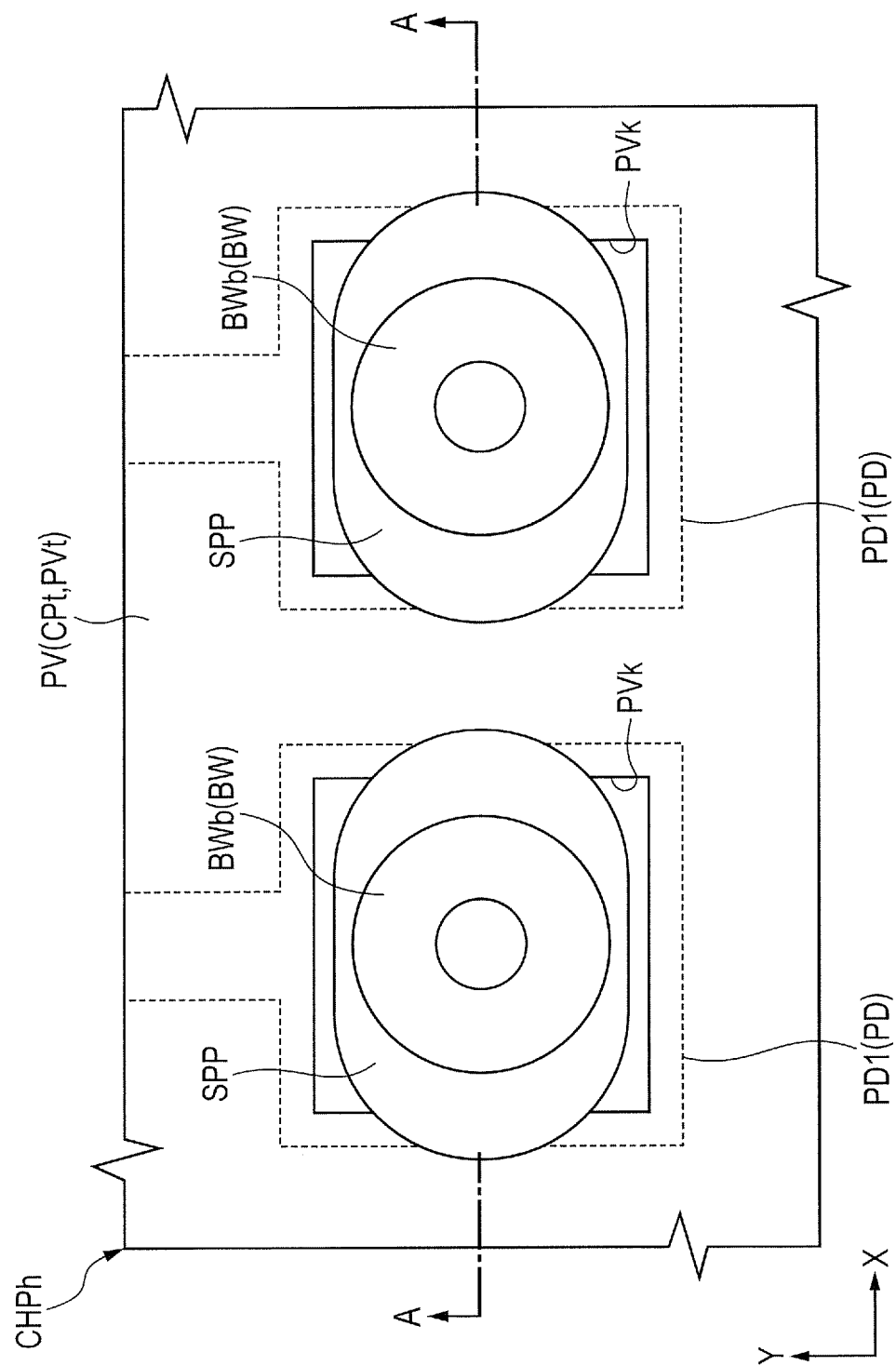
FIG. 34 is an enlarged plan view showing a comparative example against the example shown in FIG. 10.
Figure 35:
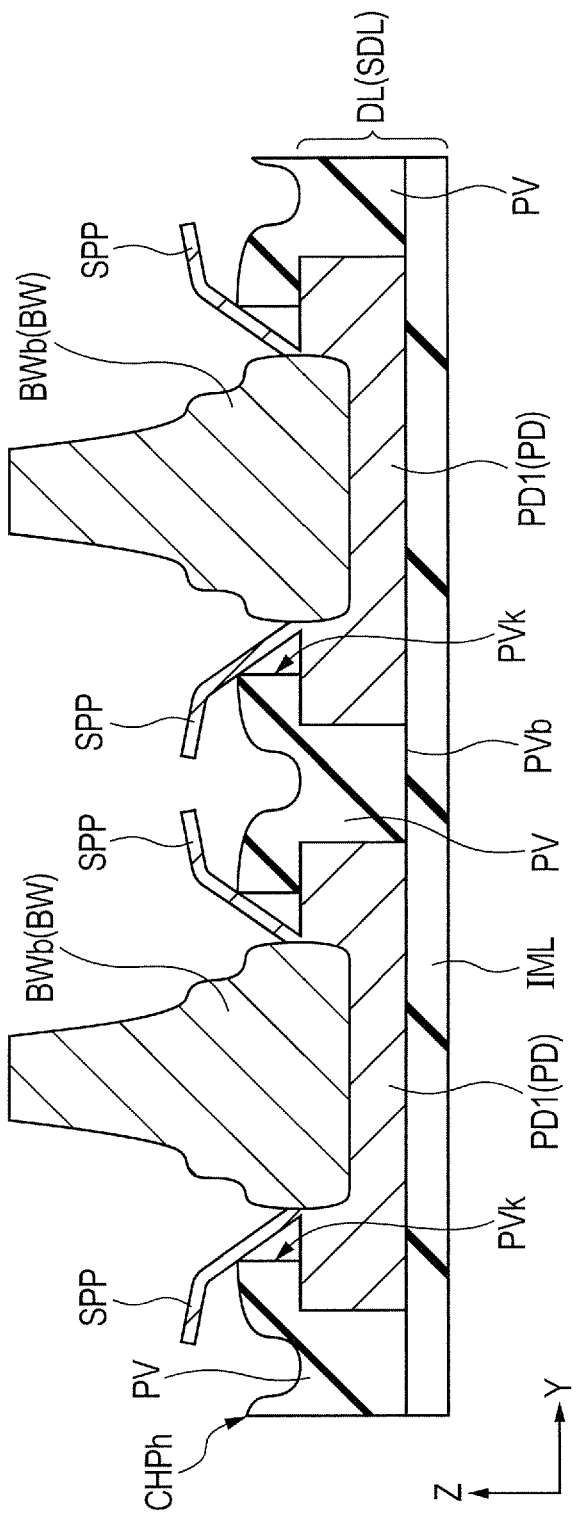
FIG. 35 is an enlarged sectional view taken along the line A-A of FIG. 34.

Next, the pads PD shown in FIGS. 5 and 7 will be described detail. FIG. 8 is an enlarged plan view of part B of FIG. 5. FIG. 9 is an enlarged sectional view taken along the line A-A of FIG. 8. FIG. 10 is an enlarged plan view showing the electrode pads (FIG. 8) to which the wires (FIG. 3) are bonded. FIG. 11 is an enlarged sectional view taken along the line A-A of FIG. 10. FIG. 34 is an enlarged plan view showing a comparative example against the example shown in FIG. 10 and FIG. 35 is an enlarged sectional view taken along the line A-A of FIG. 34. FIG. 12 is an explanatory view which schematically shows the wire bonding device used in bonding the wires to the pads as shown in FIGS. 10 and 11.

FIGS. 8 and 9 show the pads PD which are not connected with the wires BW as shown in FIG. 3 yet, in order to show the pad shape before the wire bonding step. In FIG. 8, the outline of the area covered by the protective film PV is indicated by dotted line in order to clearly show the outlines of the conductor patterns of the pads PD. FIG. 9 shows the uppermost wiring layer DL, in which the pads PD lie, among the wiring layers DL shown in FIG. 7.

The semiconductor chip CHPh shown in FIGS. 34 and 35 is the same as the semiconductor chip CHP shown in FIGS. 8 and 9 except that trenches TR1 (FIGS. 8 and 9) are not made in the exposed surfaces of the pads PD.

As shown in FIGS. 8 and 9, the pads PD in this embodiment have trenches (openings, trenches) TR1 made in the areas exposed from the protective film PV. A trench TR1 is an opening which is formed in the exposed surface of a pad PD and extends from the exposed surface to the surface opposite to it. Also, as shown in FIG. 10, the trench TR1 lies in a way to overlap the ball portion (wide portion) BWb of a wire BW in plan view. In the example shown in FIG. 10, each of the plural trenches TR1 partially overlaps the ball portion (wide portion) BWb of the wire BW.

In the example shown in FIG. 8, trenches TR1 extend along the Y direction perpendicular to the X direction in plan view. Also, in the example shown in FIG. 8, a plurality of trenches TR1 are arranged along the X direction. In the example shown in FIG. 9, the trench TR1 does not penetrate the pad PD in the thickness direction (Z direction in FIG. 9) and the insulating layer IML, the base layer of the pad PD, is not exposed at the bottom of the trench TR1.

Next, the reason that the pads PD have trenches TR1 as shown in FIGS. 8 and 9 in this embodiment, as well as the problem found by the present inventors, will be explained in detail.

In order to bond the wires BW to the pads PD of the semiconductor chip CHP and connect the wires BW with the pads PD electrically as shown in FIGS. 10 and 11, the so-called nail head bonding method may be used in which the tip of each wire BW is shaped into a ball-shaped ball portion BWb and the ball portion BWb is pressed against the exposed surface of the pad PD to bond them.

In the nail head bonding method, a thermo-compression process is generally employed in which the ball portion BWb is pressed against the heated pad PD. If bonding is performed by applying ultrasonic waves to the ball portion BWb, the wire bonding process temperature can be lower. Also, if bonding is performed by heating the pad PD and applying ultrasonic waves to the ball portion BWb, the wire bonding process temperature can be lower and the bond strength between the wire BW and pad PD can be increased. Particularly when the semiconductor chip CHP is mounted over a resin-containing substrate such as the wiring substrate WS (FIG. 4), a method in which ultrasonic waves are applied to the ball portion BWb is preferable because the process temperature must be decreased depending on the heat resistance of the substrate.

The wires BW shown in FIGS. 10 and 11 are made of, for example, copper as mentioned above. While generally the wires connected with the electrode pads of a semiconductor chip are often made of gold, in some cases they are made of a material other than gold for the purpose of material cost reduction or reduction in the impedance component of the transmission paths formed by the wires. For example, in this embodiment, the wires BW are made of copper to reduce the material cost.

In addition, the impedance component of the transmission paths formed by the wires BW can be decreased by using copper, which has higher electric conductivity than gold, as the material for the wires BW. As a variation of this embodiment, the surface of the substrate made of copper may be covered by a metal film of palladium (Pd). In this case, the bond strength between the wire BW and pad PD is further increased. As another variation of this embodiment, silver (Ag), which has higher electric conductivity than copper, may be used to make the wires BW.

Even when a material other than gold is used as the material for the wires BW as mentioned above, the nail head bonding method may be employed to bond the ball portions BWb of the wires BW to the pads PD as when the wires are made of gold.

As a result of the study of the wire bonding technique using non-gold wires by the present inventors, the following problem has been found. Like the semiconductor chip CHPh as a comparative example shown in FIGS. 34 and 35, the pads PD are deformed due to the ultrasonic waves applied to the ball portions BWb during wire bonding. The material of the pad PD is partially flaked, resulting in the formation of splash (flat pieces) SPP around the pad PD.

The splash SPP shown in FIGS. 34 and 35 is formed due to deformation of the pad PD and when the pad PD is comprised of an aluminum-based material, it is called aluminum splash (Al splash).

The splash SPP is flat as shown in FIG. 35 and the larger the amount of flaking from the pad PD during wire bonding is, the larger the plane area of the splash SPP is.

If the plane area of splash SPP is larger and splashes SPP generated on adjacent pads PD contact each other, an electric short-circuiting might occur. When splash SPP has a larger plane area, fracturing occurs more easily. If fracturing occurs and the splash SPP is separated from the pad PD, the splash SPP would become a conductive foreign body. Therefore, for the purpose of enhancing the reliability of the semiconductor device, the technique to decrease the plane area of splash SPP if any is required.

When the amount of flaking from the pad PD during wire bonding is larger, stress is concentrated on the periphery of the upper surface of the pad PD. For this reason, when the periphery of the pad PD is covered by the protective film PV, cracking might occur in the protective film PV due to the stress generated at the periphery of the pad PD. Therefore, the technique of reducing the amount of flaking from the pad PD during wire bonding is required in order to prevent cracking of the protective film PV and enhance the reliability of the semiconductor device.

Splash SPP is generated when the hardness of the ball portion BWb is higher than that of the pad PD in bonding of the wires BW. Splash SPP is more likely to be generated when the difference in hardness between the ball portion BWb and pad PD is larger in bonding of the wires BW. Here, Young's modulus or Vickers hardness may be used as a measure of hardness.

For example, if gold and aluminum are used, since the hardness of gold (Young's modulus 79 GPa (gigapascal), Vickers hardness 216 MPa (megapascal)) is higher than the hardness of aluminum (Young's modulus 70 GPa, Vickers hardness 167 MPa), splash SPP might be generated. However, since the difference in hardness between gold and aluminum is not large, splash SPP which may cause electrical short-circuiting or formation of conductive foreign bodies is less likely to be generated.

If the ball portion BWb of the wire BW is harder than gold, splash SPP is more likely to be generated. For example, the hardness of silver (Young's modulus 83 GPa, Vickers hardness 251 MPa) is higher than the hardness of aluminum and the hardness of gold, so if silver is used, splash SPP is more likely to be generated. Therefore, if the wires BW are made of a material harder than gold, it is necessary to suppress increase in the plane area of the splash SPP.

When the wires BW are made of copper, the hardness of copper (Young's modulus 110-128 GPa, Vickers hardness 369 MPa) is higher than the hardness of aluminum and the difference between them is large. If the base material of the wire is copper and covered by a palladium film, the material of the ball portion BWb is copper-palladium alloy. The copper-palladium alloy is harder than copper itself. According to the study by the present inventors, when the ball portion BWb is made of a material with Young's modulus in excess of 100 GPa, splash SPP would spread easily, so a means to prevent the spread of splash SPP is required.

Furthermore, as described above, when the amount of flaking from the pad PD during wire bonding is larger, the plane area of splash SPP will be larger. From the study by the present inventors, it has been found that not only the hardness of the ball portion BWb of the wire BW but also the thickness of the pad PD are factors that determine the amount of flaking from the pad PD.

For example, if the thickness of the pad PD comprised of aluminum is 850 nm or less, when the ball portion BWb of the wire BW of copper is bonded to it, even if the ball portion BWb of the wire BW is bonded to it, the plane area of splash SPP is less likely to be large and the spread of splash SPP can be limited to the inside of the opening PVk. On the other hand, if the thickness of the pad PD is more than 850 nm, part of the splash SPP may spread to the outside of the opening PVk. If part of the splash SPP spreads to the outside of the opening PVk, it is necessary to increase the distance between adjacent pads PD in order to prevent short-circuiting. In other words, if part of the splash SPP spreads in a way to cover the protective film PV partially, a restriction is imposed on the distance between adjacent pads PD.

In recent years, there has been a tendency toward thicker pads PD for enhanced performance of semiconductor devices. For example, by increasing the thickness of pad PD to constitute a signal transmission path, the impedance of the signal transmission path can be reduced. Also, by increasing the thickness of pad PD to constitute a supply voltage path, an instantaneous voltage drop can be prevented so that the circuit is driven stably. Therefore, considering that increase in the thickness of pad PD contributes to enhancing the performance of the semiconductor device, it is desirable to prevent the spread of splash SPP by an approach other than reducing the thickness of pad PD.

From the further study based on the above finding by the present inventors, it has been found that splash SPP is generated due to ultrasonic waves applied to the ball portion BWb during wire bonding.

When applying ultrasonic waves to the ball portion BWb in wire bonding, the wire BW is bonded using a wire bonding device WBD as schematically illustrated in FIG. 12. The wire bonding device WBD illustrated in FIG. 12 includes a capillary CP as a pressure bonding tool for bonding the ball portion BWb of a wire BW by pressure, an oscillator USG for generating ultrasonic waves, and a horn (ultrasonic transmitter) USH which connects the oscillator USG and capillary CP. The horn USH is a bar-like member extending in one direction, which amplifies ultrasonic waves US1 and transmits them to the capillary CP. In the example shown in FIG. 12, the horn USH extends in the X direction.

When bonding the wire BW to the pad PD of the semiconductor chip CHP using the wire bonding device WBD, ultrasonic waves are applied to the ball portion BWb for pressure bonding. More specifically, the ultrasonic waves US1 generated by the oscillator USG are amplified by the horn USH and transmitted through the capillary CP to the wire BW. The direction of oscillation of the ultrasonic waves US1 applied to the ball portion BWb is limited to one direction for the following reason. Since the ultrasonic waves US1 are dilatational waves (longitudinal waves), they oscillate along the direction in which the horn USH extends (X direction in FIG. 12). Also, since the capillary CP is fixed to the horn USH, the direction of oscillation of the ultrasonic waves US1 transmitted to the ball portion BWb through the capillary CP in plan view is the same as the direction in which the horn USH extends (X direction in FIG. 12).

In this case, as shown in FIGS. 34 and 35, splash SPP is generated, stretching along the direction of oscillation of ultrasonic waves US1 (FIG. 12). In the example shown in FIG. 34, the planar shape of splash SPP is ellipsoidal with its major axis extending in the X direction. In other words, a flat splash SPP extending longitudinally in the X direction is formed around the portion of a pad PD to which the ball portion BWb of the wire BW is bonded. As described above, splash SPP is generated because the ultrasonic waves US1 applied to the ball portion BWb to bond the ball portion BWb to the pad PD cause the material of the pad PD to flake off partially in the direction of oscillation of the ultrasonic waves US1.

Based on the above finding, the present inventors considered that the spread of splash SPP can be suppressed by decreasing the volume of the pad PD. Consequently the present inventors have come to conceive of the idea of this embodiment that the amount of flaking from the pad PD is reduced by forming an opening (which corresponds to a trench TR1 shown in FIGS. 8 and 9) in the portion of the pad PF to be bonded to the ball portion BWb, before the wire bonding step.

The amount of flaking from the pad PD in the direction of oscillation (X direction) of the ultrasonic waves US1 (FIG. 12) applied during wire bonding can be reduced by making trenches TR1 as shown in FIGS. 8 and 9. As a consequence, splash SPP may be generated but its spread is suppressed as shown in FIGS. 10 and 11. In the example shown in FIGS. 10 and 11, splash SPP is generated in an area which overlaps the opening where the pad PD is exposed, in the thickness direction. In other words, even in this embodiment shown in FIGS. 10 and 11, a flat splash SPP extending longitudinally in the X direction is formed around the portion of the pad PD to which the ball portion BWb of the wire BW is bonded. In this embodiment, the structure of the pad PD to which the wire BW has been bonded is as follows: the trenches TR1 of the pad PD have portions extending in the Y direction perpendicular to the X direction, with the joint of the ball portion BWb and pad PD between them.

Thus, according to this embodiment, the spread of splash SPP is suppressed and even if splash SPP is formed on each of adjacent pads PD, the splashes SPP are prevented from contacting each other.

Also, according to this embodiment, the distance between adjacent pads PD can be shortened by suppressing the spread of splash SPP. This means that a plurality of pads PD can be arranged at small intervals and thus the plane area of the semiconductor chip CHP can be decreased.

According to this embodiment, when the spread of splash SPP is suppressed, the splash SPP hardly fractures. As a consequence, the generation of conductive foreign bodies attributable to fracture of the splash SPP is less likely to occur.

According to this embodiment, the formation of trenches TR1 suppresses the spread of splash SPP. Therefore, as shown in FIG. 9, a portion of a pad PD in which a trench TR1 is made is thinner and a portion thereof in which no trench TR1 is made is thicker. As shown in FIG. 11, the portion of the pad PD which overlaps the ball portion BWb of the wire BW deforms along the shape of the ball portion BWb when the ball portion BWb is bonded. Consequently the pad PD portion around the bond interface between the ball portion BWb of the wire BW and the pad PD is thick. Consequently, when the pad PD shown in FIGS. 10 and 11 constitutes a signal transmission path, the impedance of the signal transmission path is reduced. Also, for example, when the pad PD shown in FIGS. 10 and 11 constitutes a supply voltage path, an instantaneous voltage drop is prevented so that the circuit is driven stably. In short, according to this embodiment, the electrical characteristics of the joint between the pad PD and ball portion BWb are improved as compared with an embodiment in which the thickness of the pad PD is simply decreased.

As described above, the splash SPP spreads in the direction of oscillation of ultrasonic waves US1 (FIG. 12). Therefore, it is preferable that trenches TR1 be made so as to extend along the Y direction perpendicular to the X direction in which the ultrasonic waves US1 oscillate, as shown in FIG. 8. Consequently the amount of flaking from the pad PD along the direction of oscillation is surely reduced.

According to this embodiment, the presence of trenches TR1 reduces the amount of flaking from the pad PD during wire bonding. Therefore, as shown in FIGS. 8 and 9, even when the periphery of the pad PD is covered by the protective film PV as shown in FIGS. 8 and 9, the protective film PV is prevented from cracking due to the stress generated at the periphery of the pad PD.

As a variation of the example shown in FIG. 8, a single trench TR1 may be formed. In this case, the amount of flaking from the pad PD along the direction of oscillation can be reduced by increasing the width of the trench TR1 (width of the opening in the direction perpendicular to the direction in which the trench extends). However, in order to reduce the amount of flaking from the pad PD regardless of wire BW bonding positional accuracy, it is preferable that a plurality of trenches TR1 be arranged along the X direction as shown in FIG. 8. In other words, if the group of trenches TR1 shown in FIG. 8 is considered as a single trench, it is preferable that the trench made in the pad PD extend along the Y direction and include a plurality of portions arranged along the X direction.

As a variation of the example shown in FIG. 9, trenches TR1 may be made in a way to penetrate the pad PD in the thickness direction to make slits. In this case as well, the amount of flaking from the pad PD along the direction of oscillation can be reduced. However, in order to improve the electrical characteristics of the joint by increasing the area of contact between the pad PD and ball portion BWb, it is preferable that the trenches TR1 do not penetrate the pad PD in the thickness direction (Z direction in FIG. 9).

While the width and depth of a trench TR1 may be varied, the average thickness of the portion of the pad D overlapping the ball portion BWb of the wire BW can be used as a guideline for suppressing the spread of splash SPP. Average thickness Tav of the portion of the pad PD overlapping the ball portion BWb of the wire BW is expressed by the equation Tav=VL1÷SM1, where VL1 denotes the volume of the portion of the pad PD overlapping the ball portion BWb and SM1 denotes the plane area of the portion of the pad PD overlapping the ball portion BWb. Volume VL1 is the volume of the portion of the pad PD to which the ball portion BWb is not bonded yet.

According to the study by the present inventors, in order to suppress the spread of splash SPP to the outside of the opening PVk, it is preferable that the average thickness Tav of the portion of the pad PD overlapping the ball portion BWb of the wire BW be 1 μm or less. Furthermore, it is particularly preferable that the average thickness Tav of the portion of the pad PD overlapping the ball portion BWb of the wire BW be 850 nm or less.

In the example shown in FIGS. 8 and 9, the width of a trench TR1 is 5 μm, the distance between adjacent trenches TR1 is 10 μm, the trench depth is 375 nm, and the thickness immediately below the trench TR1 is 600 nm. In this case, regardless of the diameter of the ball portion BWb shown in FIGS. 10 and 11, the portion of the pad PD overlapping the ball portion BWb of the wire BW has an average thickness Tav of 850 nm or less.

Figure 13:
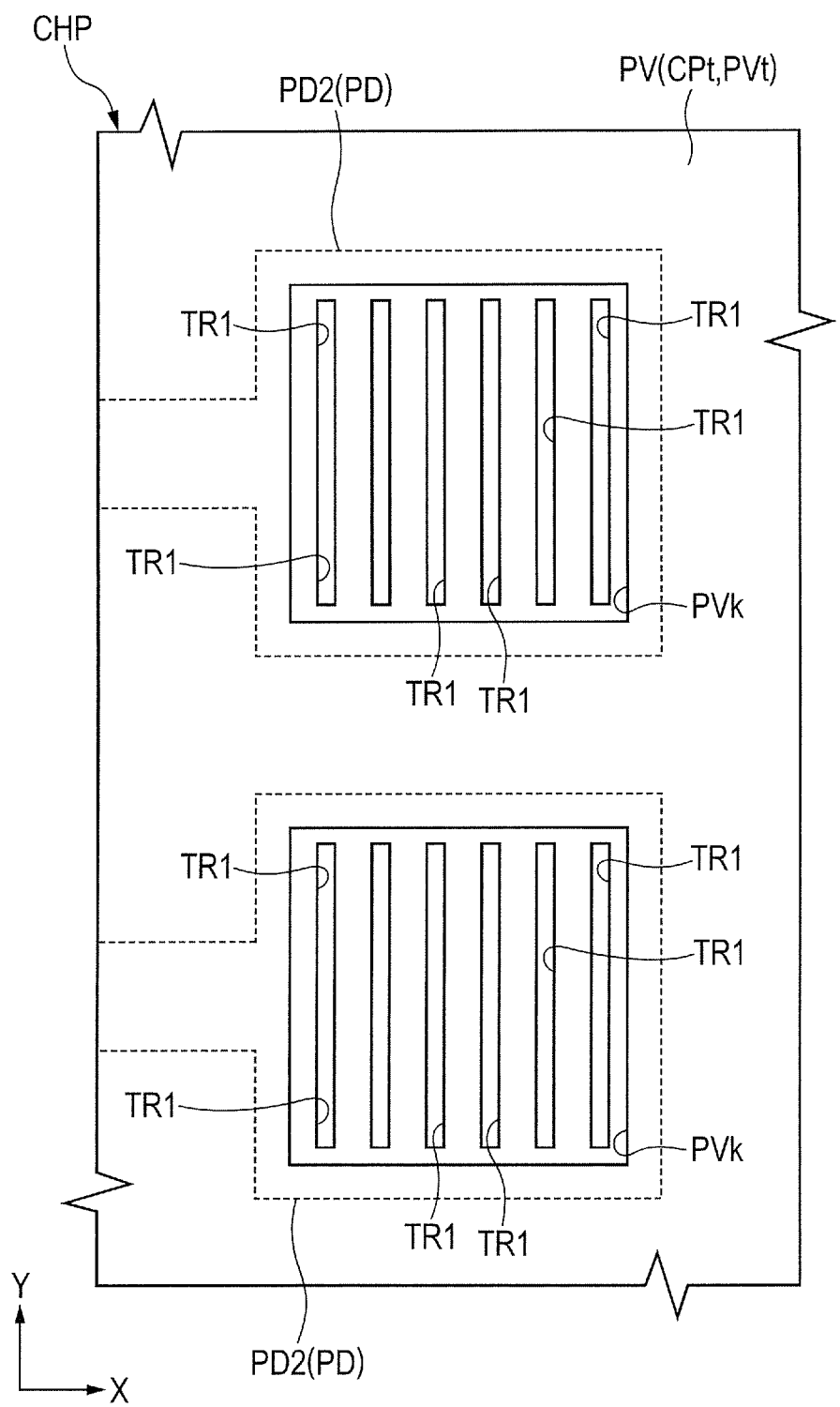
FIG. 13 is an enlarged plan view of part C of FIG. 5.
Figure 14:
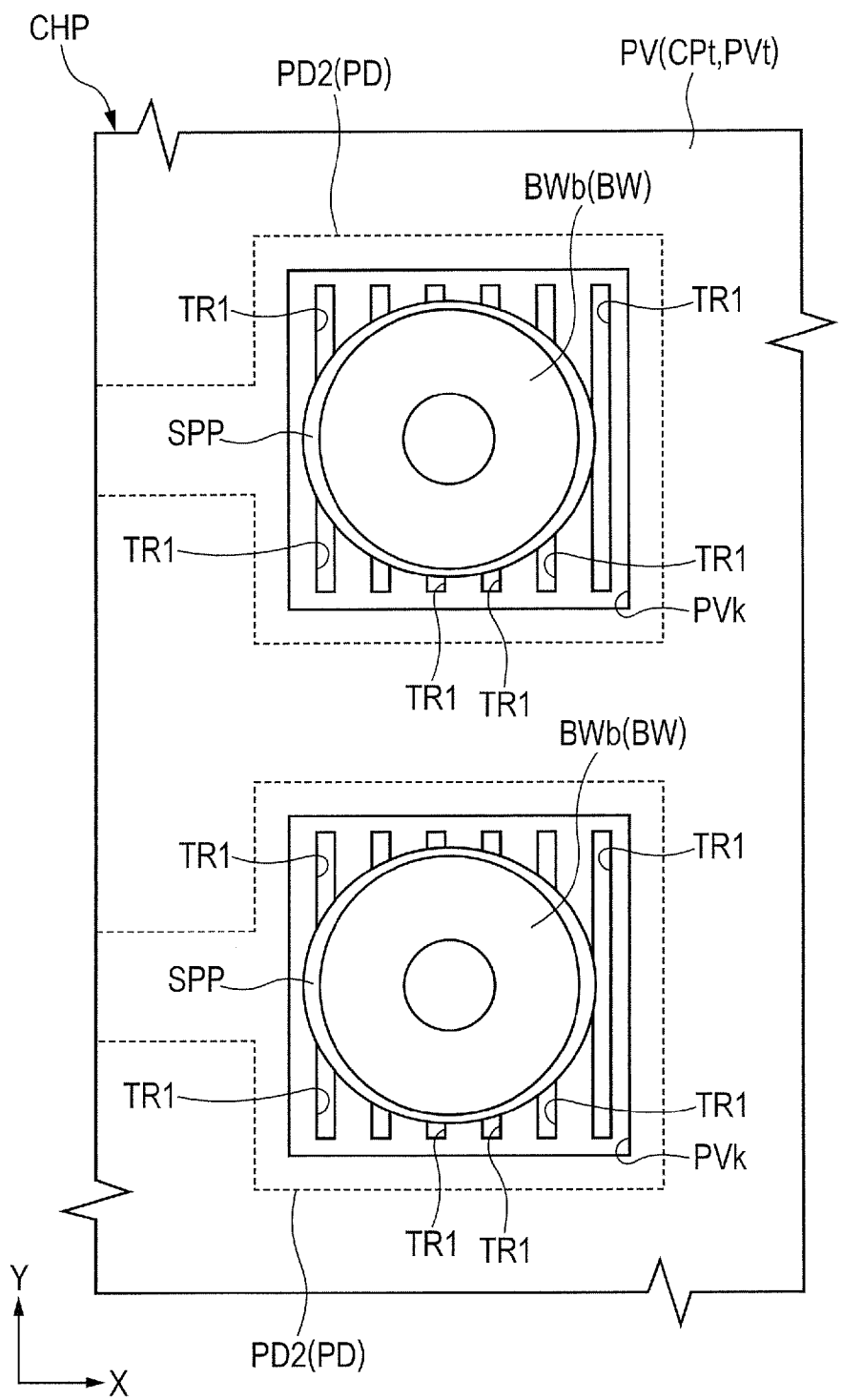
FIG. 14 is an enlarged plan view showing electrode pads (shown in FIG. 13) to which wires (shown in FIG. 3) are bonded.
Figure 15:
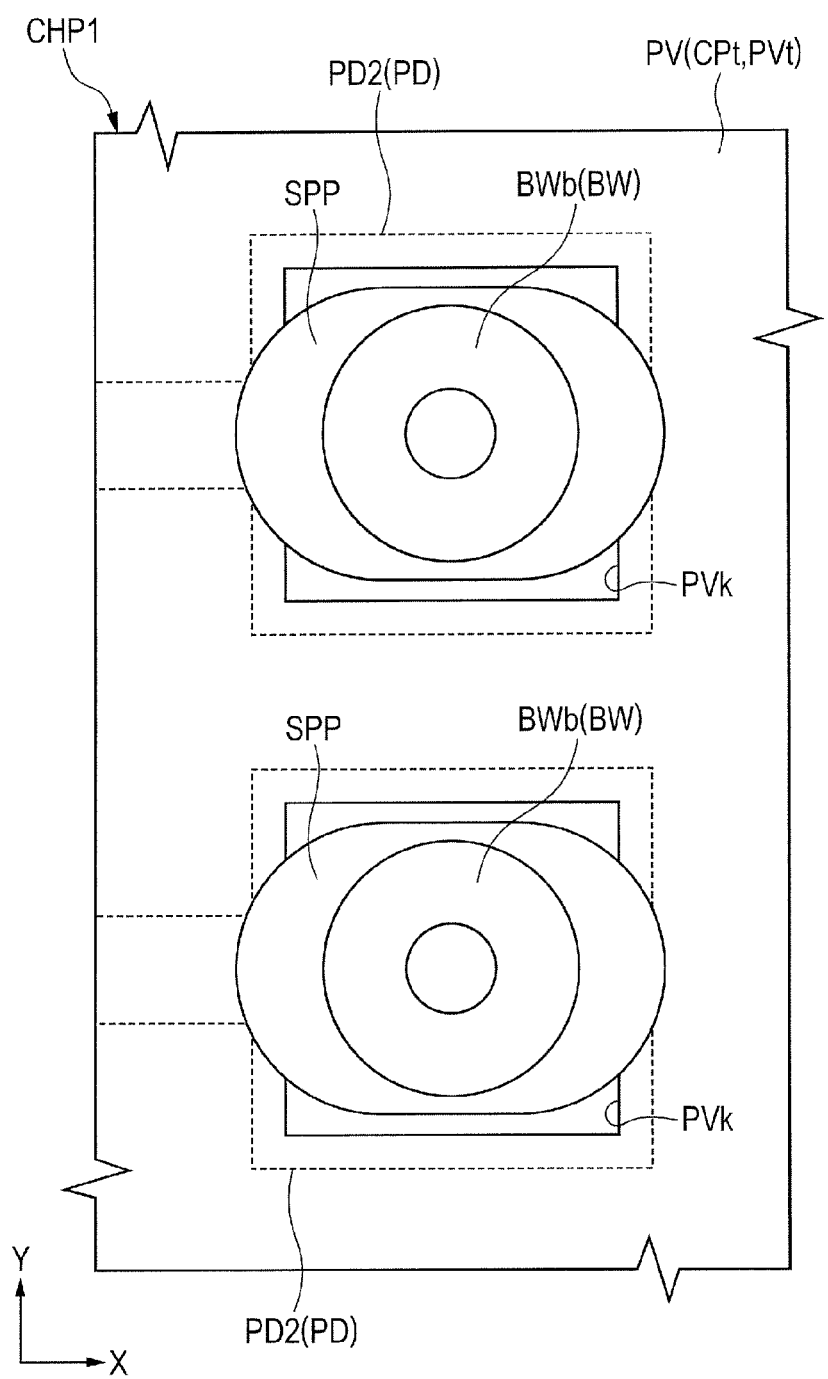
FIG. 15 is an enlarged plan view showing a variation of the example shown in FIG. 14.

Next, what type of trench TR1 (FIG. 8) should be made in which pad PD among the exposed pads PD on the front surface CPt as shown in FIG. 5 will be discussed. FIG. 13 is an enlarged plan view of part C of FIG. 5. FIG. 14 is an enlarged plan view showing electrode pads (FIG. 13) to which wires are bonded. FIG. 15 is an enlarged plan view showing a variation of the example shown in FIG. 14. In order to indicate the shape of the pad before wire bonding, FIG. 13 shows the electrodes to which wires BW are not bonded yet.

As described above, splash SPP (FIG. 8) is generated, extending in the direction of oscillation of ultrasonic waves US1 (FIG. 12). In this embodiment, since ultrasonic waves US1 oscillate along the X direction, in order to prevent the splashes SPP of adjacent pads PD from contacting each other, trenches TR1 should be made only in a pad PD adjacent to another pad PD along the X direction. Specifically, in the example shown in FIG. 5, as the plural pads PD2 arranged along the sides CPs2 extending in the Y direction perpendicular to the X direction in which ultrasonic waves oscillate are concerned, short-circuiting does not occur between adjacent pads PD even when no trenches TR1 are made.

The semiconductor chip CHP1 shown in FIG. 15 is a variation in which no trenches TR1 (FIG. 14) are made in the pads PD2. In other words, the semiconductor chip CHP1 is different from the semiconductor chip CHP shown in FIG. 14 in that no trenches are made in each of the pads PD2. Since the semiconductor chip CHP1 has no trenches TR1, splash SPP spreads largely. However, another pad PD does not exist in the direction of spread of splash SPP, so there is no possibility that short-circuiting between adjacent pads PD occurs due to the splash SPP.

However, in order to prevent the splash SPP from spreading largely to the extent that the splash SPP fractures and becomes conductive foreign bodies as described above, it is desirable to make trenches TR1 in the pad PD2 as shown in FIG. 13.

As shown in FIG. 13, the periphery of the pad PD2 is covered by the protective film PV in plan view. Therefore, in order to prevent the protective film PV from cracking due to the stress generated at the periphery of the pad PD2, it is desirable to make trenches TR1 in the pad PD2.

Preferably, the trenches TR1 are made in the pad PD2 so that they have portions extending longitudinally in the Y direction crossing (in FIG. 13, perpendicular to) the X direction in which ultrasonic waves US1 (FIG. 12) oscillate, as shown in FIG. 13. Since splash SPP extends along the direction of oscillation of ultrasonic waves US1 as described above, it is preferable that the direction in which the trenches TR1 extend be determined according to the direction of oscillation of ultrasonic waves US1.

For this reason, in the case of the pads PD1 shown in FIG. 8, the trenches TR1 extend along the Y direction crossing the direction of arrangement of the pads PD1 (X direction). On the other hand, in the case of the pads PD2 shown in FIG. 13, the trenches TR1 extend along the Y direction of arrangement of the pads PD2 (Y direction).

The presence of the trenches TR1 in the pads PD2 suppresses the spread of splash SPP as shown in FIG. 14, thereby reducing the possibility of fracture of the splash SPP. In addition, the trenches TR1 in the pads PD2 contribute to reduction of the amount of flaking from the pads PD2 during wire bonding, thereby reducing the possibility of cracking of the protective film PV due to the stress generated at the periphery of the pad PD2.

Semiconductor Device Manufacturing Process

Figure 16:
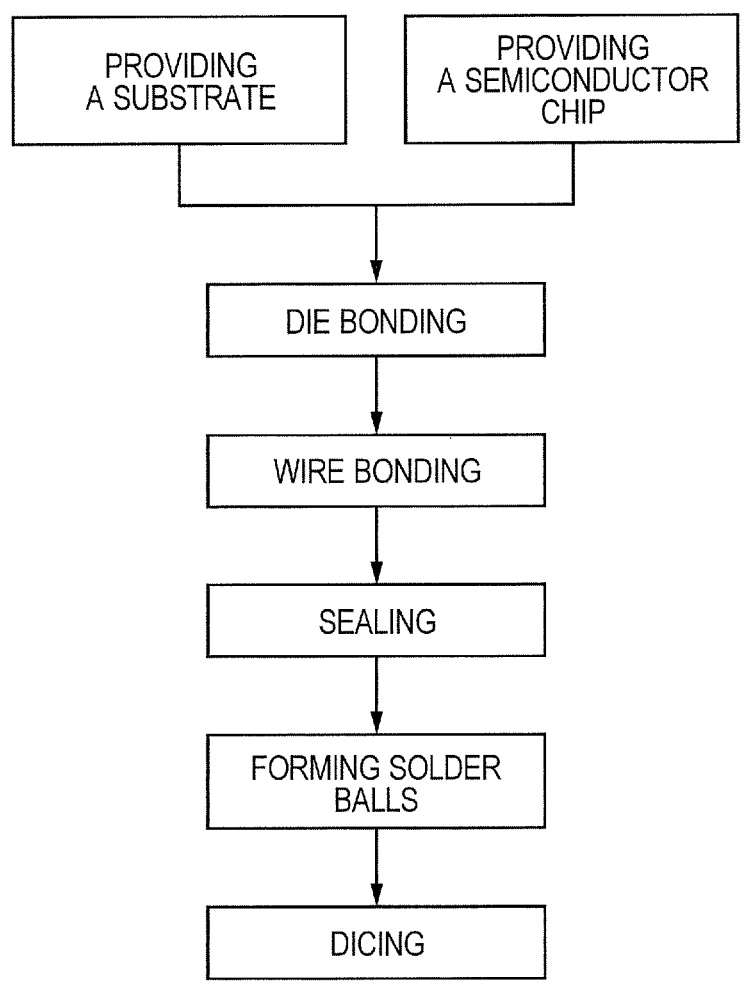
FIG. 16 is a flowchart which explains the sequence of assembling a semiconductor device according to an embodiment of the invention.

Next, the method of manufacturing the semiconductor device 1 shown in FIG. 1 will be described. The semiconductor device 1 according to this embodiment is manufactured according to the assembling sequence shown in FIG. 16. FIG. 16 is a flowchart which explains the sequence of assembling the semiconductor device according to this embodiment.

1. Step of Providing a Substrate

Figure 17:
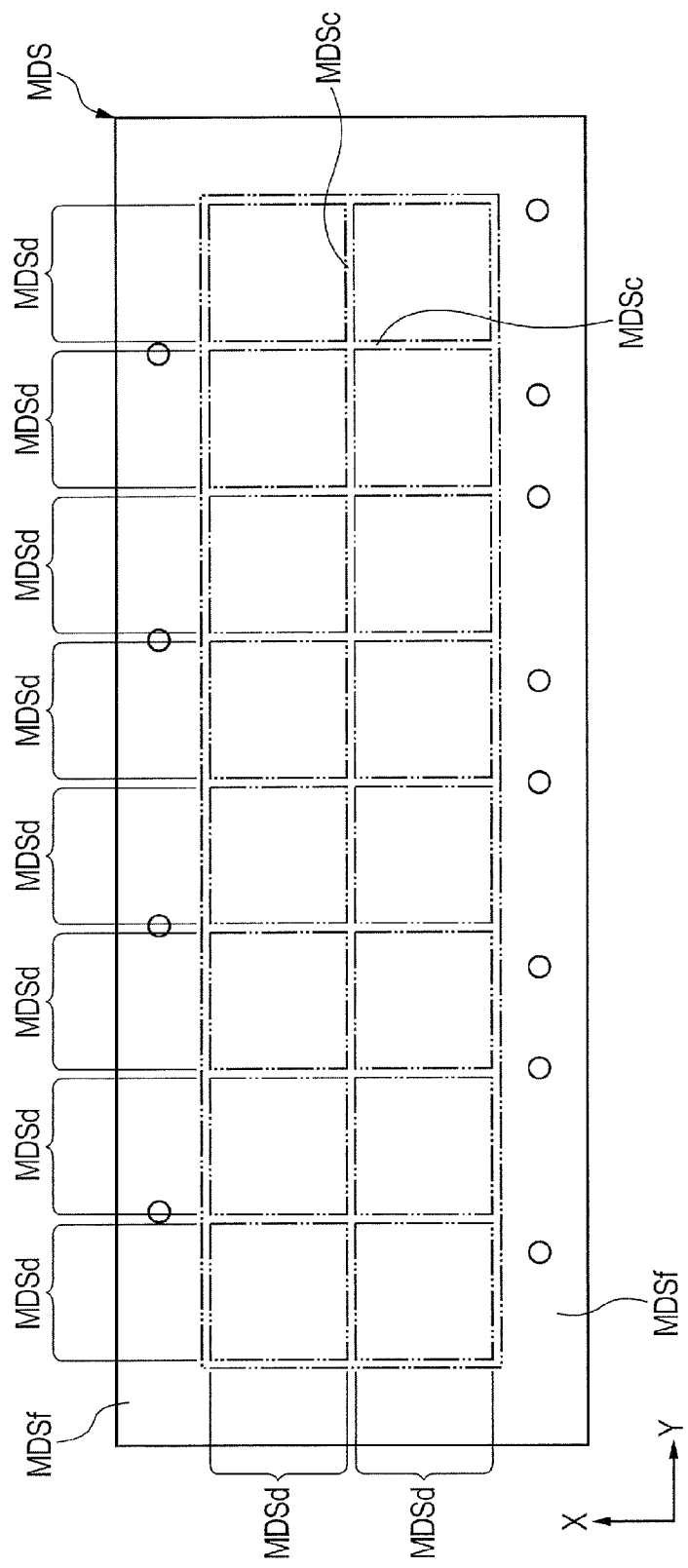
FIG. 17 is a plan view showing the general structure of a wiring substrate provided at the step of providing a substrate as shown FIG. 16.

First, at the step of providing a substrate (FIG. 16), a wiring substrate MDS as shown in FIG. 17 is provided. FIG. 17 is a plan view showing the general structure of the wiring substrate provided at the step of providing a substrate (FIG. 16).

As shown in FIG. 17, the wiring substrate MDS provided at this step has a plurality of device formation areas MDSd inside a frame MDSf. Specifically, a plurality of device formation areas MDSd are arranged in a matrix pattern. In this embodiment, sixteen device formation areas MDSd are arranged in a matrix pattern (2 rows by 8 columns in the example shown in FIG. 17), although the number of device formation areas MDSd is not limited to the one shown in FIG. 17. In short, the wiring substrate MDS is a so-called multi-piece substrate which has a plurality of device formation areas MDSd.

Each device formation area MDSd corresponds to the wiring substrate WS shown in FIG. 4. As shown in FIG. 4, each device formation area MDSd includes an upper surface (front surface, chip mounting surface) WSt, a plurality of bonding leads (terminals, chip mounting surface side terminals, electrodes) BL formed on the upper surface WSt, a lower surface (back surface, mounting surface) WSb opposite to the upper surface WSt, and a plurality of lands (terminals, external terminals) LD formed on the lower surface WSb. The bonding leads BL and lands LD are electrically connected through a plurality of wirings WSw (FIG. 4) formed in each device formation area MDSd.

A dicing region (dicing line) MDSc in which dicing of the wiring substrate MDS is to be done at the dicing step (FIG. 16) is provided around each device formation area MDSd. As shown in FIG. 17, a dicing region MDSc lies between adjacent device formation areas MDSd and between the frame MDSf and a device formation area MDSd in a way to surround each device formation area MDSd.

2. Step of Providing a Semiconductor Chip

At the step of providing a semiconductor chip (FIG. 16), a semiconductor chip CHP as shown in FIG. 5 is provided. At this step, a semiconductor wafer is provided which includes a plurality of semiconductor elements Q1 (FIG. 7) on the main surface of the semiconductor wafer (not shown) of, for example, silicon and wiring layers DL (FIG. 7) connected with them electrically. Also a plurality of pads PD (FIG. 5) are formed in the uppermost layer among the wiring layers DL.

A protective film PV (FIG. 7) is formed so as to cover the uppermost wiring layer DL in which the pads PD are formed. An opening PVk (FIG. 8) is formed in the protective film PV so that each of the pads PD is at least partially exposed. The trenches TR1 (FIGS. 8 and 13) can be made in the exposed area of each of the pads PD, for example, by etching.

After the semiconductor wafer is formed as described above, a dicing blade (not shown) is moved along the dicing lines of the semiconductor wafer to dice the semiconductor wafer and obtain a plurality of semiconductor chips CHP as shown in FIG. 5.

3. Die Bonding Step

Figure 18:
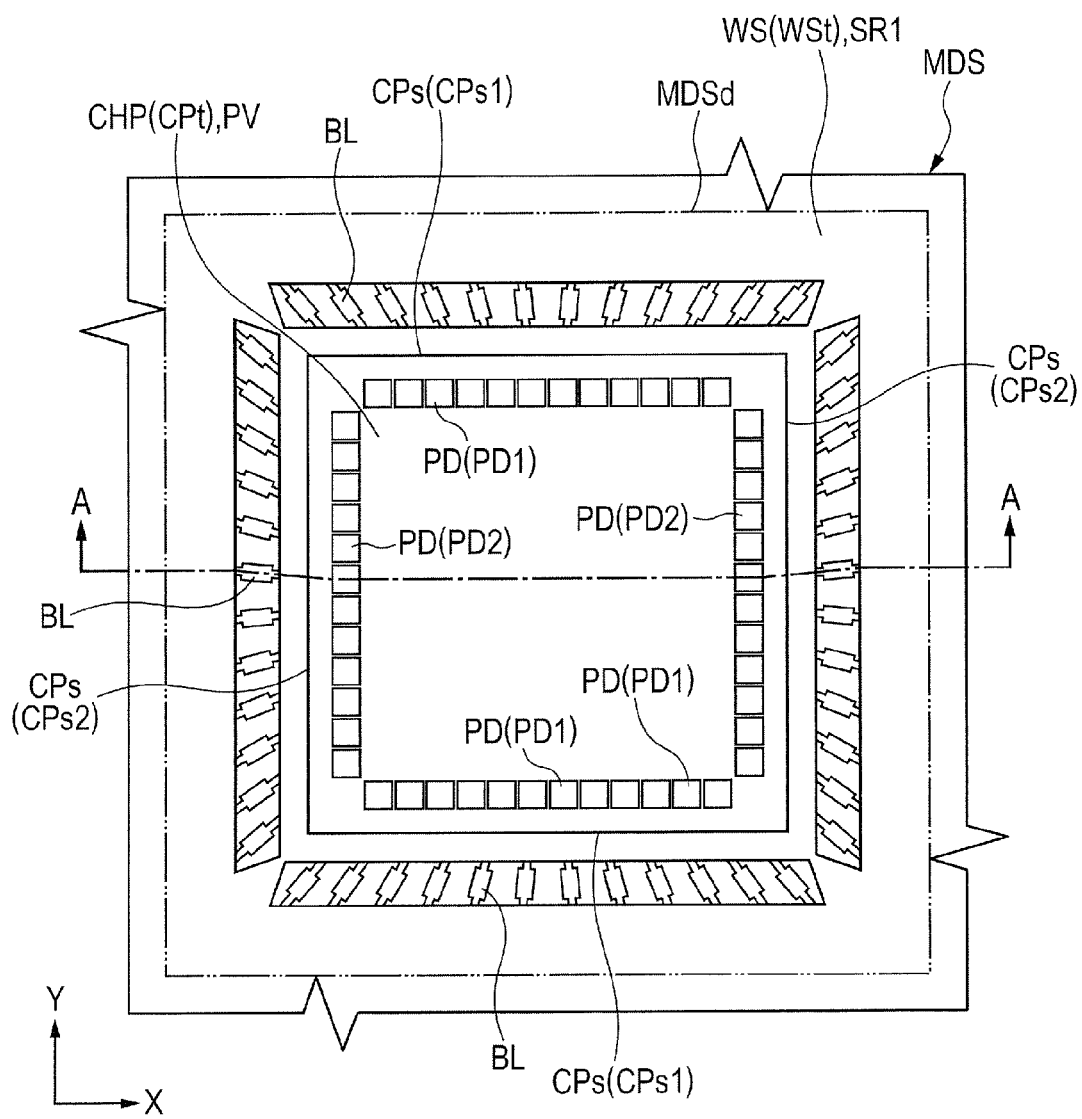
FIG. 18 is an enlarged plan view showing a semiconductor chip mounted over the wiring substrate shown in FIG. 17.
Figure 19:
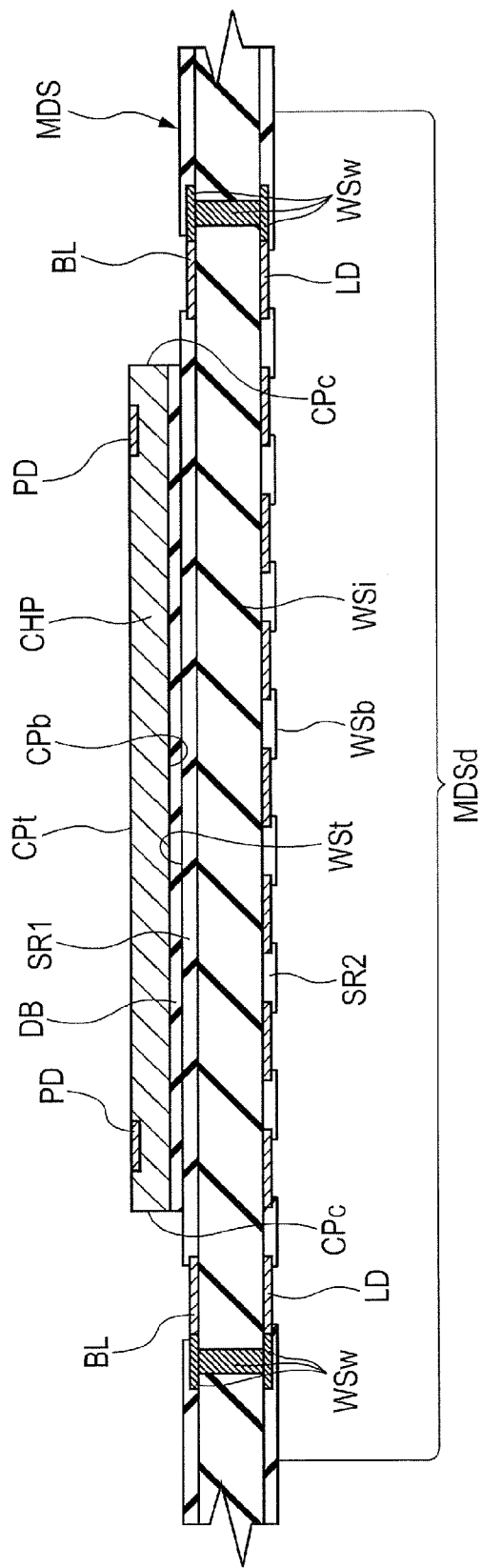
FIG. 19 is an enlarged sectional view taken along the line A-A of FIG. 18.

Next, at the die bonding step (FIG. 16), the semiconductor chip CHP is mounted over the chip mounting region of the device formation area MDSd of the wiring substrate MDs as shown in FIGS. 18 and 19 and bonded and fixed. FIG. 18 is an enlarged plan view showing the semiconductor chip mounted over the wiring substrate shown in FIG. 7 and FIG. 19 is an enlarged sectional view taken along the line A-A of FIG. 18.

At this step, the semiconductor chip CHP is mounted (bonded and fixed) over the chip mounting region of the upper surface WSt of each device formation area MDSd of the wiring substrate MDS. As shown in FIG. 19, this embodiment adopts the so-called face-up mounting method in which the semiconductor chip CHP is mounted over the wiring substrate MDS through die bond (adhesive) DB so that its lower surface CPb faces to the upper surface WSt of the device formation area MDSd of the wiring substrate MDS.

The die bond DB is an adhesive which bonds and fixes the semiconductor chip CHP to the wiring substrate MDS; for example, it takes the form of a paste before hardening. When a paste bond is used to mount the semiconductor chip CHP, the paste bond is put on the chip mounting region of the device formation area MDSd before mounting the semiconductor chip CHP. Then the paste bond is flattened by pushing the semiconductor chip CHP against the chip mounting region before it is hardened, for example, by heating, to fix the semiconductor chip CHP. However, the die bond DB is not limited to the above. For example, it may be resin film called DAF (Die Attach Film) or the like. If the die bond DB is such film, it may be a double-faced adhesive tape (film) including adhesive layers on the both sides and in this case, the tape is attached to the back surface CPb of the semiconductor chip CHP in advance and the semiconductor chip CHP is bonded through the tape. After that, the thermosetting resin component contained in the die bond DB is thermally hardened to fix the semiconductor chip CHP.

4. Wire Bonding Step

Figure 20:
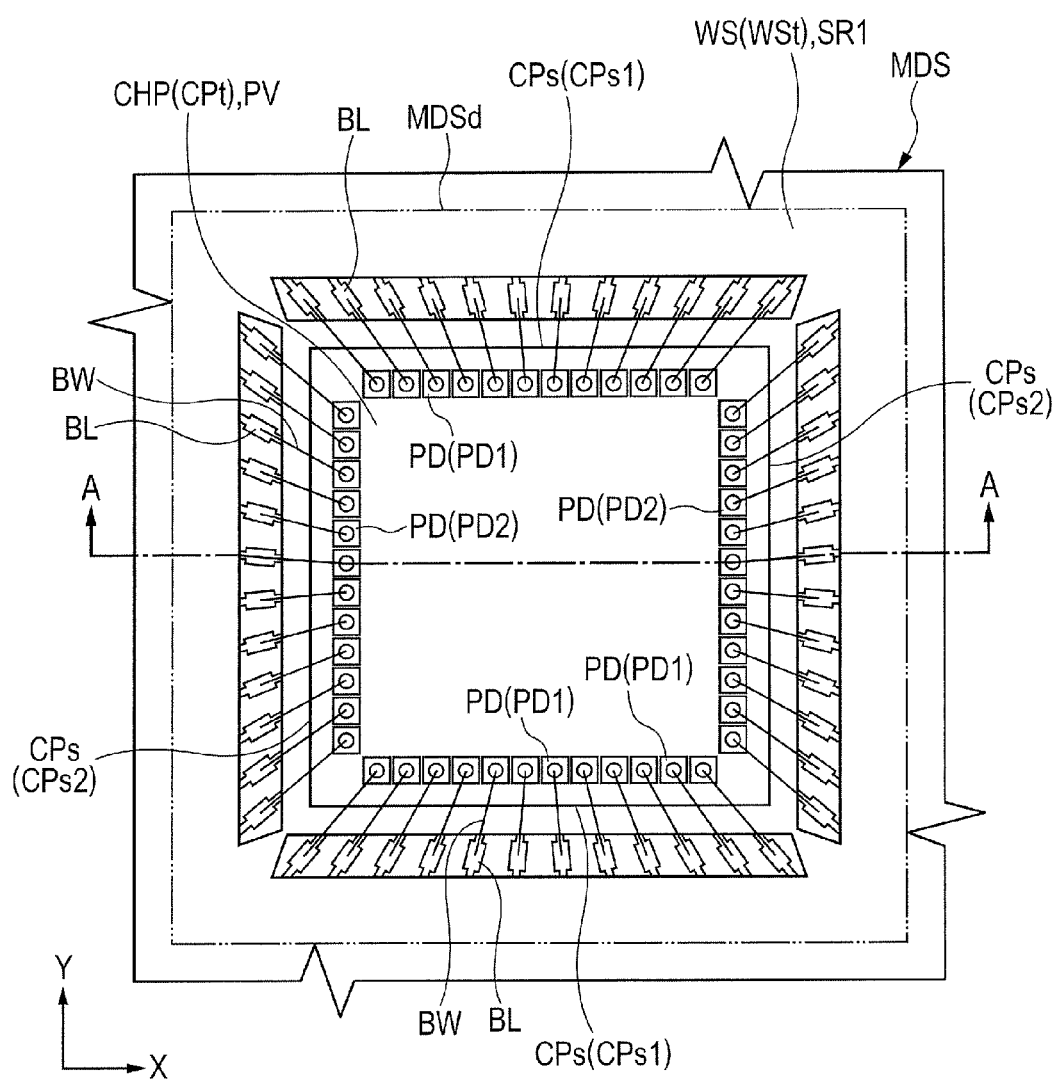
FIG. 20 is an enlarged plan view showing the semiconductor chip and wiring substrate shown in FIG. 18 which are electrically connected by wire bonding.
Figure 21:
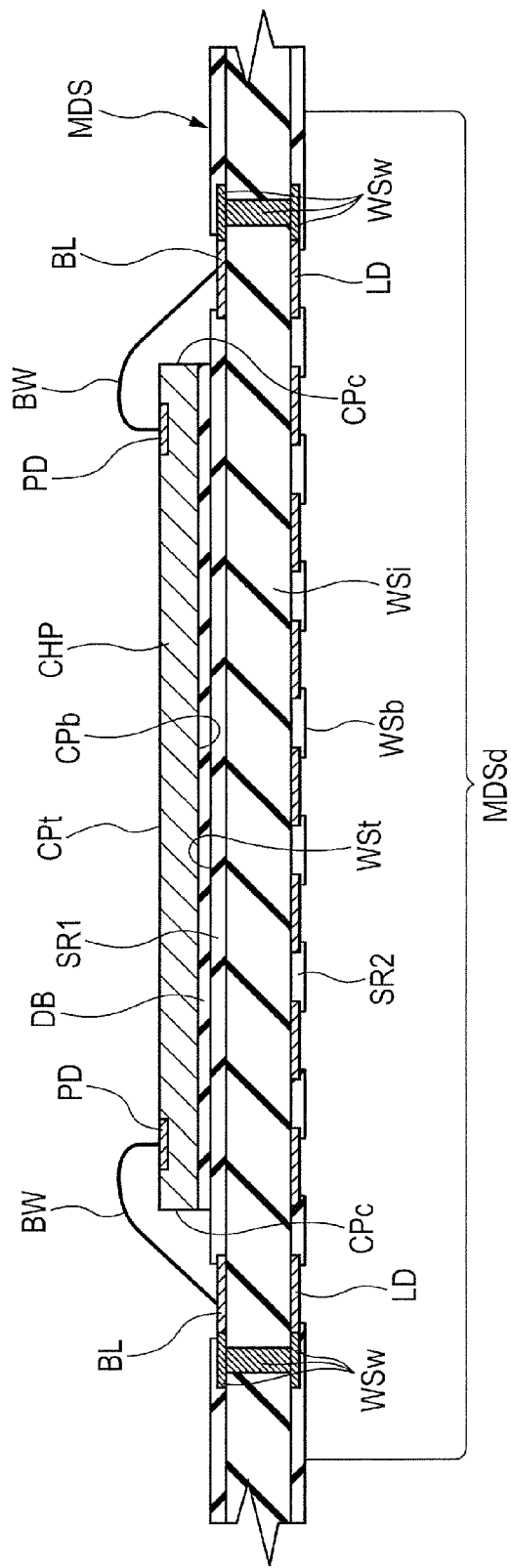
FIG. 21 is an enlarged sectional view taken along the line A-A of FIG. 20.
Figure 22:
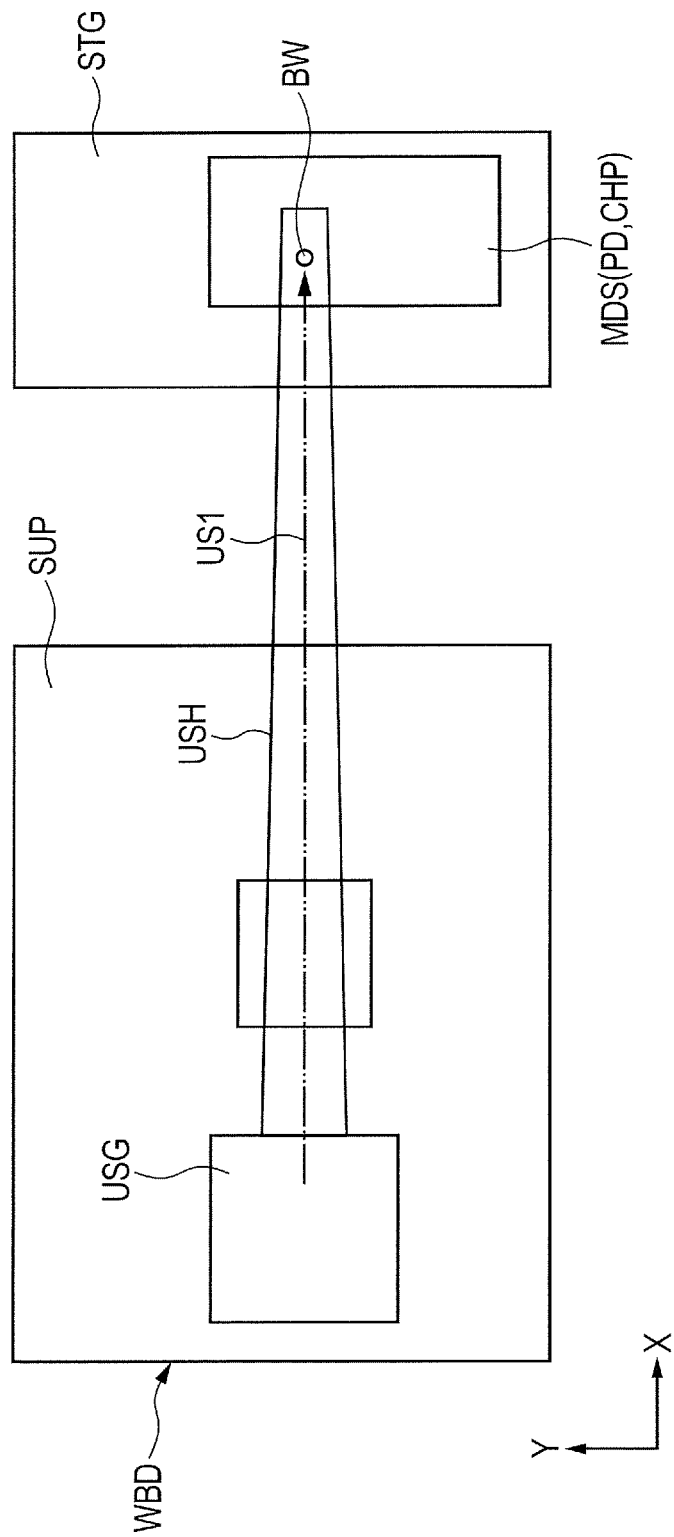
FIG. 22 is a plan view schematically showing the planar positional relation between the wire bonding device shown in FIG. 12 and the wiring substrate shown in FIG. 20.
Figure 23:
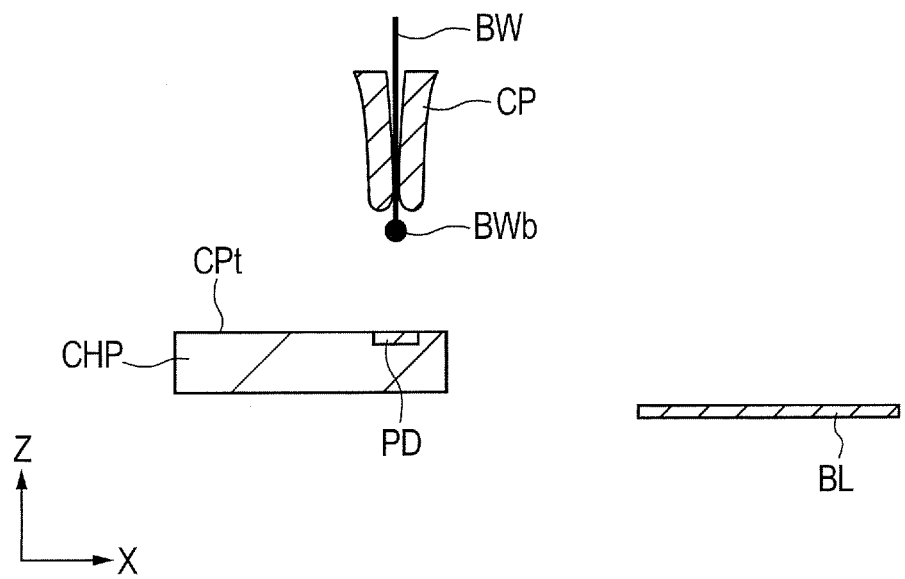
FIG. 23 is a fragmentary enlarged sectional view showing a ball portion formed at the tip of a wire protruding from the bottom of a capillary at the wire bonding step shown in FIG. 16.
Figure 24:
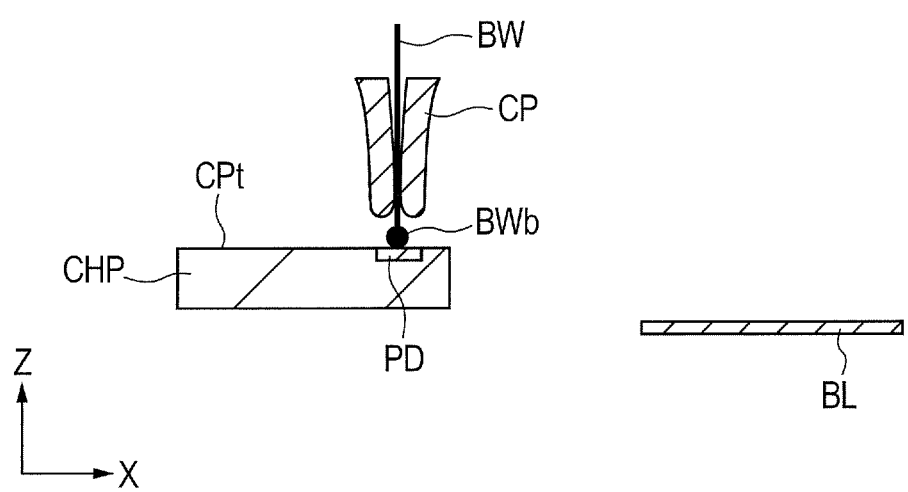
FIG. 24 is a fragmentary enlarged sectional view showing the ball portion shown in FIG. 23 which is in contact with the pad.
Figure 25:
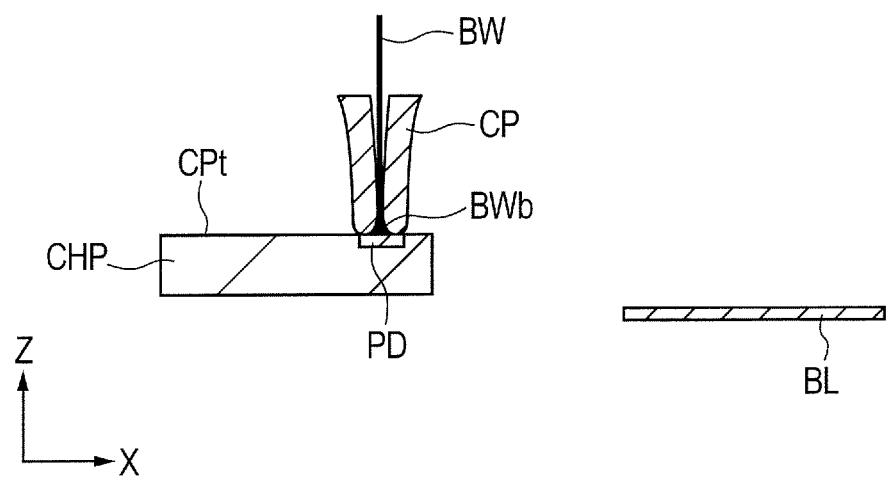
FIG. 25 is a fragmentary enlarged sectional view showing the ball portion (shown in FIG. 24) held pressed by application of a load.
Figure 26:
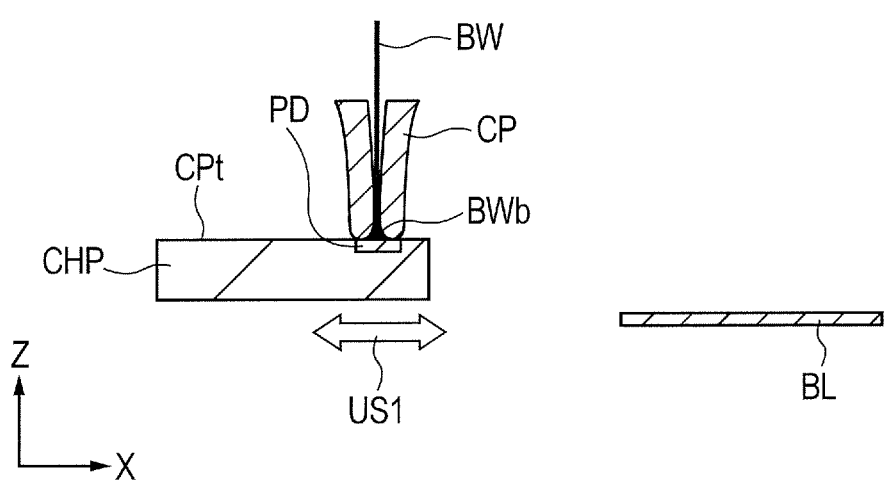
FIG. 26 is a fragmentary enlarged sectional view showing the ball portion (shown in FIG. 25) to which ultrasonic waves are applied.

Next, at the wire bonding step (FIG. 16), as shown in FIGS. 20 and 21, the pads PD of the semiconductor chip CHP and the bonding leads BL of the wiring substrate MDS are electrically connected through the wires BW. FIG. 20 is an enlarged plan view showing the semiconductor chip CHP and wiring substrate MDS (FIG. 18) which are electrically connected by wire bonding and FIG. 21 is an enlarged sectional view taken along the line A-A of FIG. 20. FIG. 22 is a plan view which schematically shows the planar positional relation between the wire bonding device (FIG. 12) and the wiring substrate (FIG. 20). FIG. 23 is a fragmentary enlarged sectional view showing a ball portion formed at the tip of a wire protruding from the bottom of the capillary at the wire bonding step (FIG. 16). FIG. 24 is a fragmentary enlarged sectional view showing the ball portion shown in FIG. 23 which is in contact with the pad. FIG. 25 is a fragmentary enlarged sectional view showing the ball portion shown in FIG. 24 held pressed by application of a load. FIG. 26 is a fragmentary enlarged sectional view showing the ball portion shown in FIG. 25 to which ultrasonic waves are applied.

At this step, as shown in FIGS. 20 and 21, the bonding leads BL formed in the device formation area MDSd of the wiring substrate MDS are electrically connected with the pads PD formed on the front surface CPt of the semiconductor chip CHP through the wires (conductive members) BW. This embodiment adopts the so-called normal bonding method of electrically connecting the pads PD and bonding leads BL, in which it is assumed that the pads PD of the semiconductor chip CHP are on the first bond side and the bonding leads BL of the wiring substrate MDS are on the second bond side.

Next, the wire bonding step based on the normal bonding method will be described in detail. As described earlier referring to FIGS. 5 to 15, in this embodiment, trenches TR1 where the ball portions BWb of the wires BW are to be bonded are made in the exposed surface of each pad PD in order to reduce the amount of flaking from the pad PD during bonding. The preferable shape and other conditions of the trenches TR1 have already been described, so their description is omitted here.

At this step, for example, the wire bonding device WBD is located next to a stage STG on which the wiring substrate MDS is fixed, as shown in FIG. 22. For example, the wiring substrate MDS and the wire bonding device WBD are located in the positional relation as shown in FIG. 22. Specifically, the wire bonding device WBD is installed so that its horn USH extends along the X direction in plan view and the wiring substrate MDS is placed opposite to the oscillator USG with the horn USH between them. Consequently ultrasonic waves US1 which oscillate along the X direction can be applied to the ball portion BWb (FIG. 12) of the wire BW.

The wire bonding device WBD has a support SUP which supports the bonding head including the capillary CP, horn USH and oscillator USG which are shown in FIG. 12. The support SUP can be freely moved along the X-Y plane shown in FIG. 22, so by moving the support SUP to move the bonding head, wires BW can be connected with the pads PD of the wiring substrate MDS.

At the wire bonding step in this embodiment, as shown in FIG. 23, a ball portion BWb is formed at the end of the wire BW protruding from the bottom of the capillary CP (ball forming step). The ball portion BWb is formed by letting an electric torch (not shown) discharge electricity.

Next, as shown in FIG. 24, the capillary CP is moved toward the pad PD of the semiconductor chip CHP to bring the ball portion BWb into contact with the pad PD (ball portion contact step). At this time, in this embodiment, trenches TR1 as shown in FIGS. 8 and 13 are provided so that they overlap the ball portion BWb in the thickness direction. This means that at this step, the ball portion BWb is moved towards at least some portions of the trenches TR1 in the pad PD.

Next, as shown in FIG. 25, a load is applied to the ball portion BWb through the capillary CP to press the ball portion BWb in the thickness direction of the pad PD (load applying step). At this time, since the ball portion BWb and the pad PD have been heated, an alloy layer comprised of the aluminum of the pad PD and the metal (for example, copper) of the ball portion BWb is formed in the contact interface between the pad PD and the ball portion BWb.

Next, as shown in FIG. 26, ultrasonic waves US1 are applied to the ball portion BWb through the capillary CP to bond the ball portion BWb to the pad PD (ultrasonic wave applying step). As ultrasonic waves US1 are applied to the ball portion BWb, the ball portion BWb oscillates due to the ultrasonic waves US1. As a consequence, an alloy layer is easily formed in the bond interface between the ball portion BWb and the pad PD.

Therefore, by carrying out the ultrasonic wave applying step as in this embodiment, the process temperature can be decreased at the wire bonding step. In addition, the strength of bond between the ball portion BWb and the pad PD is increased.

Next, while the wire BW is being let out, the capillary CP (FIG. 26) is moved until the wire BW takes the form of a loop, for example, as shown in FIG. 21. Then, as shown in FIG. 21, the wire BW is finished by bonding another portion of the wire BW (wire end opposite to the ball portion BWb shown in FIG. 26) to the bonding lead BL.

As described above, the ultrasonic waves US1 applied at this step oscillate along the direction in which the horn USH (FIG. 2) extends and do not oscillate in any other direction. As described earlier referring to FIGS. 8 to 15, in this embodiment, trenches TR1 are made in the pad PD and the ball portion BWb is bonded in a way to overlap the trenches TR1. This can decrease the plane area of splash SPP (FIG. 10) generated by bonding the ball portion BWb to the pad PD while applying ultrasonic waves US1, as mentioned above.

In this embodiment, trenches TR1 (FIG. 8) are made in the pad PD before the wire bonding step. Therefore, ultrasonic waves US1 (FIG. 26) can be applied at any desired time during the wire bonding step.

For example, in this embodiment, the pad PD and the ball portion BWb can be comprised to contact each other while ultrasonic waves US1 are being applied to the ball portion BWb through the capillary CP (FIGS. 12 and 22). In this case, the ball portion BWb contacts the pad PD while it is oscillating.

Furthermore, at the load applying step described above referring to FIG. 25, a load can be applied to the ball portion BWb while ultrasonic waves US1 (FIG. 26) are being applied to the ball portion BWb, so that the ball portion BWb is pressed in the thickness direction of the pad PD. In this case, an alloy layer is formed between the ball portion BWb and the pad PD more easily than when the ball portion BWb is simply pressed, so the process temperature at the wire bonding step can be decreased. In addition, the strength of bond between the ball portion BWb and the pad PD can be increased.

Furthermore, if ultrasonic waves US1 are applied at the load applying step, a load and ultrasonic waves US1 can be successively applied to the ball portion BWb at the ultrasonic wave applying step described above referring to FIG. 26. In this case, there is no distinction between the load applying step (described above referring to FIG. 25) and the ultrasonic wave applying step (described above referring to FIG. 26) and upon completion of bonding, application of the load and application of ultrasonic waves US1 are stopped.

The support SUP of the wire bonding device WBD (FIG. 22) can be freely moved in the X-Y plane shown in FIG. 22. By adjusting the amount of movement of the support SUP, the relative positional relation between the ball portion BWb and the pad PD in plan view can be changed (this operation is called scrub operation) while the ball portion BWb (FIG. 25) is being pressed.

When the ball portion BWb is oscillated by scrub operation, the ball portion BWb can be mechanically oscillated at a relatively low frequency (for example, 100 to 300 Hz). Therefore, when the ball portion BWb is oscillated by scrub operation, even if the amount of flaking from the pad PD is large, splash SPP like the one shown in FIG. 34 hardly occurs. In scrub operation, the direction of oscillation is not limited to one direction. Therefore, by oscillating the ball portion BWb in various directions by scrub operation, even if splash SPP occurs, it spreads evenly around the joint of the ball portion BWb. This prevents the splash SPP from spreading to a large extent.

At this wire bonding step, if scrub operation is first carried out to decrease the thickness of the portion of the pad PD to be bonded to the ball portion BWb before ultrasonic waves US1 (FIG. 22) are applied, the spread of splash SPP is suppressed.

However, if the thickness of the pad PD is decreased by scrub operation, it takes longer time to bond a ball portion BWb to one pad PD. Furthermore, since in scrub operation, the support SUP (FIG. 22) is mechanically moved for oscillation, it is difficult to control the direction of oscillation and the oscillation frequency accurately.

For the above reason, it is desirable to make trenches TR1 (FIG. 8) in the pad PD in order to suppress the spread of splash SPP as in this embodiment. When the spread of splash SPP is suppressed by the trenches TR1, the manufacturing efficiency is improved.

In this embodiment, scrub operation is not performed in the period after the ball portion contact step (described above referring to FIG. 24) until application of ultrasonic waves US1 to the ball portion BWb. From another point of view, this may be considered as follows. In this embodiment, the ball portion contact step (described above referring to FIG. 24), the load applying step (described above referring to FIG. 25), and the ultrasonic wave applying step (described above referring to FIG. 26) are continuously carried out. From a further point of view, it may be considered as follows. In this embodiment, ultrasonic waves US1 (FIG. 26) are applied at the ball portion contact step (described above referring to FIG. 24) while the relative positional relation between the ball portion BWb and the pad PD which are in contact with each other is maintained in plan view.

Therefore, according to this embodiment, scrub operation time can be shortened and bonding time for each of the pads PD can also be shortened. Consequently the manufacturing efficiency is improved.

However, for the purpose of suppressing the spread of splash SPP, scrub operation is omissible. If scrub operation is needed for another reason, scrub operation may be performed during the load applying step or the ultrasonic wave applying step.

5. Sealing Step

Figure 27:
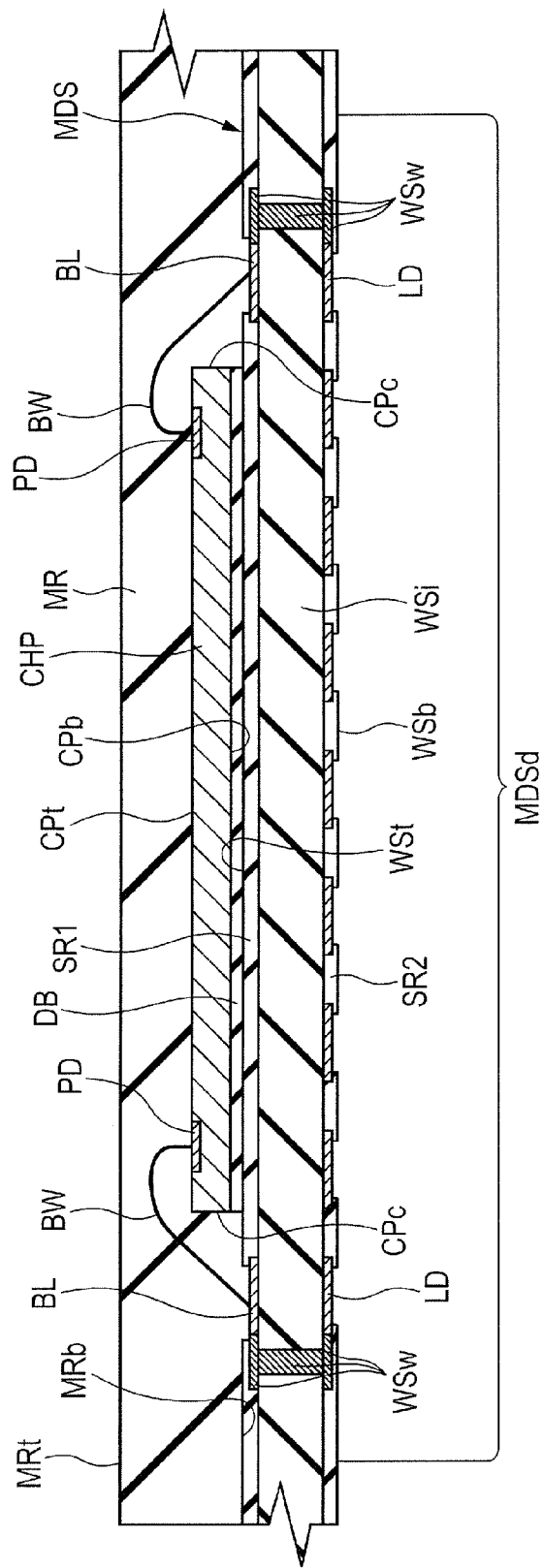
FIG. 27 is an enlarged sectional view showing the semiconductor chip and wires (shown in FIG. 21) which are sealed with resin.

Next, at the sealing step (FIG. 16), the semiconductor chip CHP and a plurality of wires BW are sealed with resin as shown in FIG. 27. FIG. 27 is an enlarged sectional view showing the semiconductor chip CHP and wires BW shown in FIG. 21 which are sealed with resin.

At this step, the so-called transfer mold method is used in which a wiring substrate MDS is placed in a mold with a cavity (not shown) and the upper surface WSt of the wiring substrate MDS is sealed with resin, then the resin is hardened to make a sealing body MR.

FIG. 27 shows an example which uses the so-called MAP (Mold Array Process) to make a sealing body MR, in which resin sealing is performed by covering a plurality of device formation areas MDSd integrally by one mold cavity. In the case of the MAP, since the sealing body MR is made so as to cover the plural device formation areas MDSd integrally, the dicing regions MDSc are also covered by the sealing body MR.

6. Step of Forming Solder Balls

Figure 28:
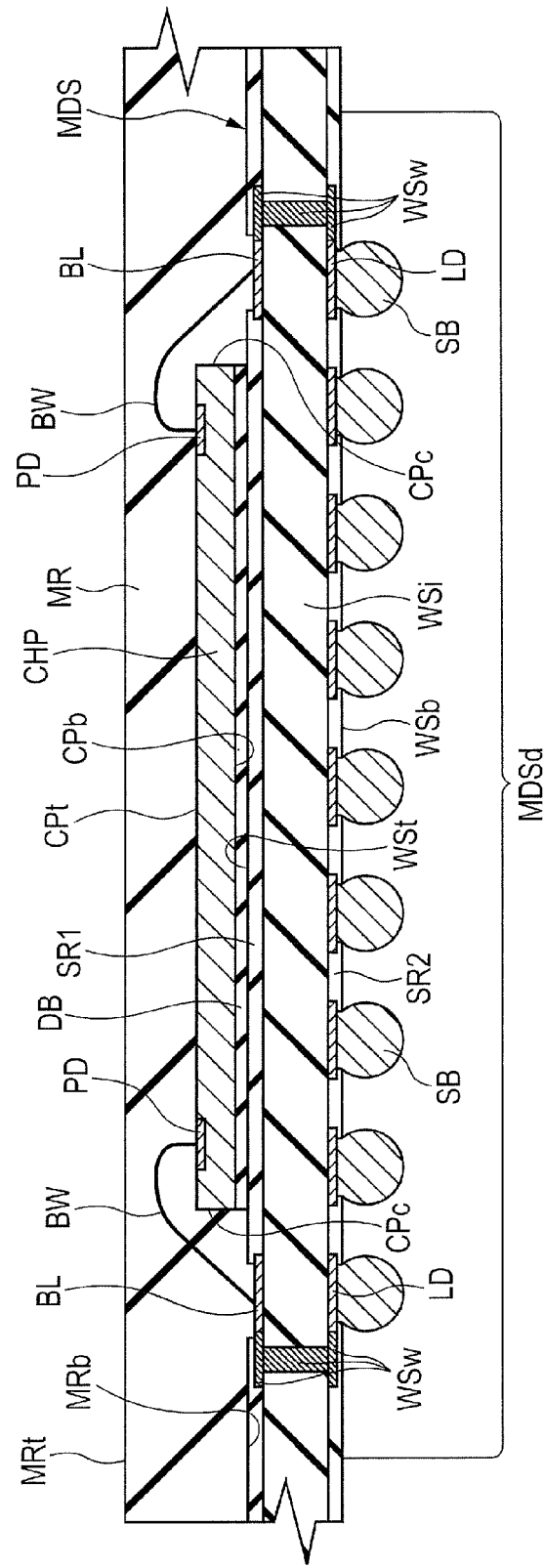
FIG. 28 is an enlarged sectional view showing a solder ball formed on the exposed surface of each of the lands shown in FIG. 27.

Next, at the step of forming solder balls (FIG. 16), as shown in FIG. 28, a solder ball SB is formed so as to cover the exposed surface of each land LD. FIG. 28 is an enlarged sectional view showing a solder ball formed on the exposed surface of each of the lands shown in FIG. 27.

At this step, solder balls SB can be formed, for example, by carrying out a reflow process on a plurality of solder balls SB which are each placed on the exposed surface of each of a plurality of lands LD. Although this embodiment is explained on the assumption that solder balls SB are formed on the exposed surfaces of lands LD, this step may be omitted in a variation of the embodiment in which solder balls SB are not formed. Also, at this step, a thin solder film may be formed on the exposed surfaces of the lands LD.

7. Dicing Step

Figure 29:
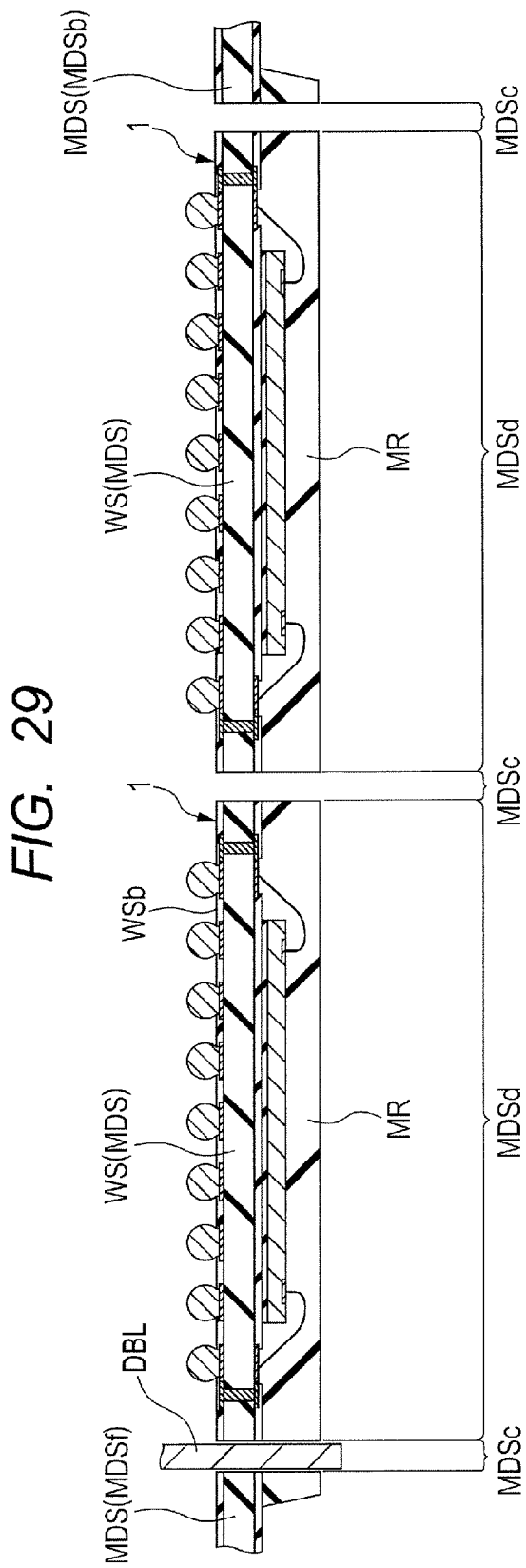
FIG. 29 is an enlarged sectional view showing the wiring substrate (shown in FIG. 28) which has been cut by a dicing blade.

Next, at the dicing step (FIG. 16), a plurality of semiconductor devices 1 are obtained by dividing the wiring substrate MDS to separate its device formation areas MDSd from each other as shown in FIG. 29. FIG. 29 is an enlarged sectional view showing the wiring substrate (FIG. 28) which has been cut by a dicing blade.

At this step, as shown in FIG. 29, the dicing blade (rotary blade) DBL is moved along the dicing regions (dicing lines) MDSc to cut (divide) the wiring substrate MDS and the sealing body MR to separate it into individual device formation regions MDSd. Thus, each of the device formation regions MDSd is separated from adjacent device formation regions MDSd and the frame MDSf to obtain a plurality of semiconductor devices 1. More specifically, after this step, the semiconductor devices 1 are subjected to necessary inspections and tests including an appearance test and electrical tests and a semiconductor device 1 which passes the inspections and tests becomes a finished semiconductor device as shown in FIG. 1. Then the finished semiconductor devices 1 are shipped or mounted on mounting substrates (not shown).

<Variations>

The invention made by the present inventors has been so far explained concretely in reference to the preferred embodiment thereof. However, the invention is not limited thereto and it is obvious that these details may be modified in various ways without departing from the spirit and scope thereof.

Variation 1

Figure 30:
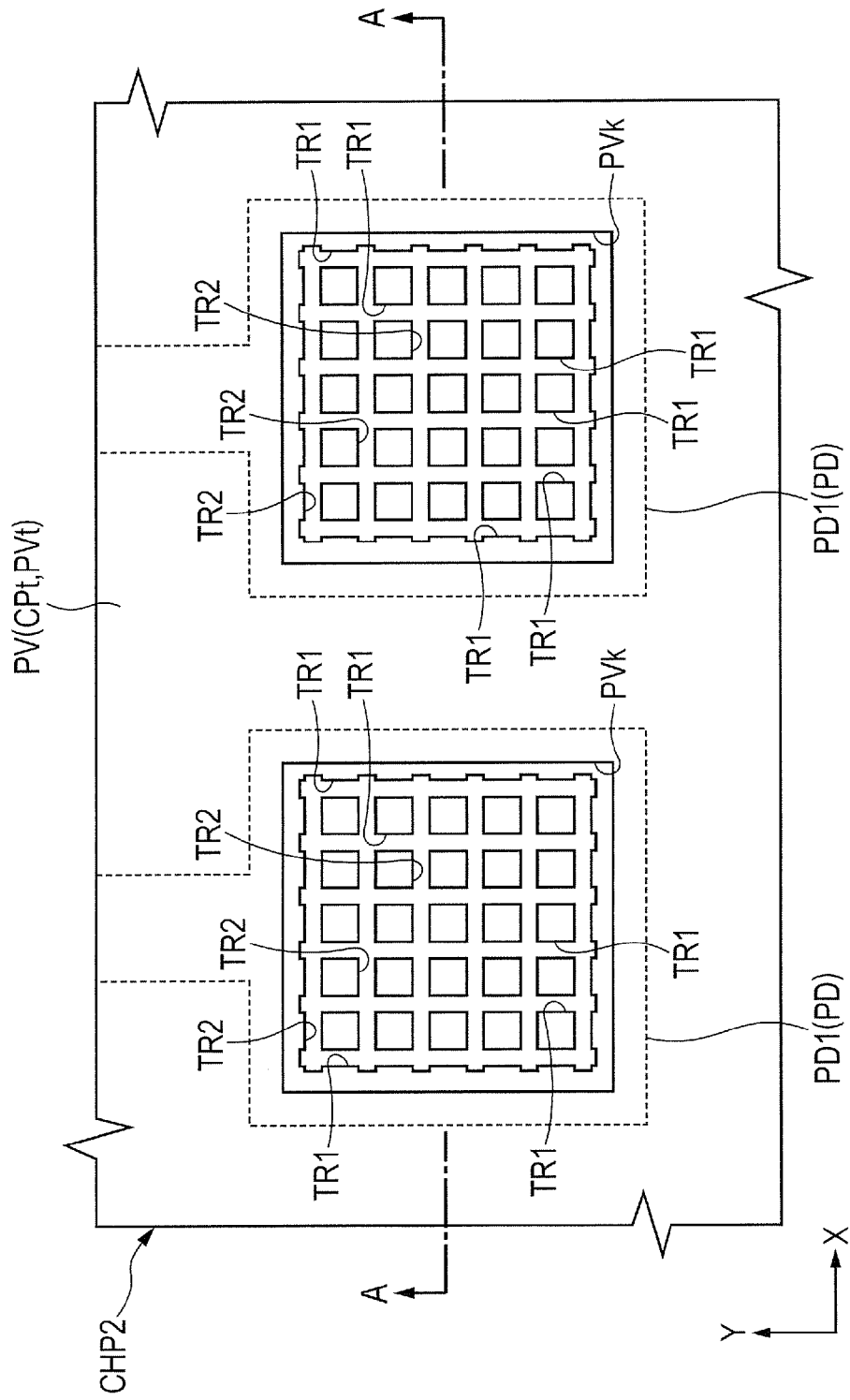
FIG. 30 is an enlarged plan view showing a variation of the example shown in FIG. 8.
Figure 31:
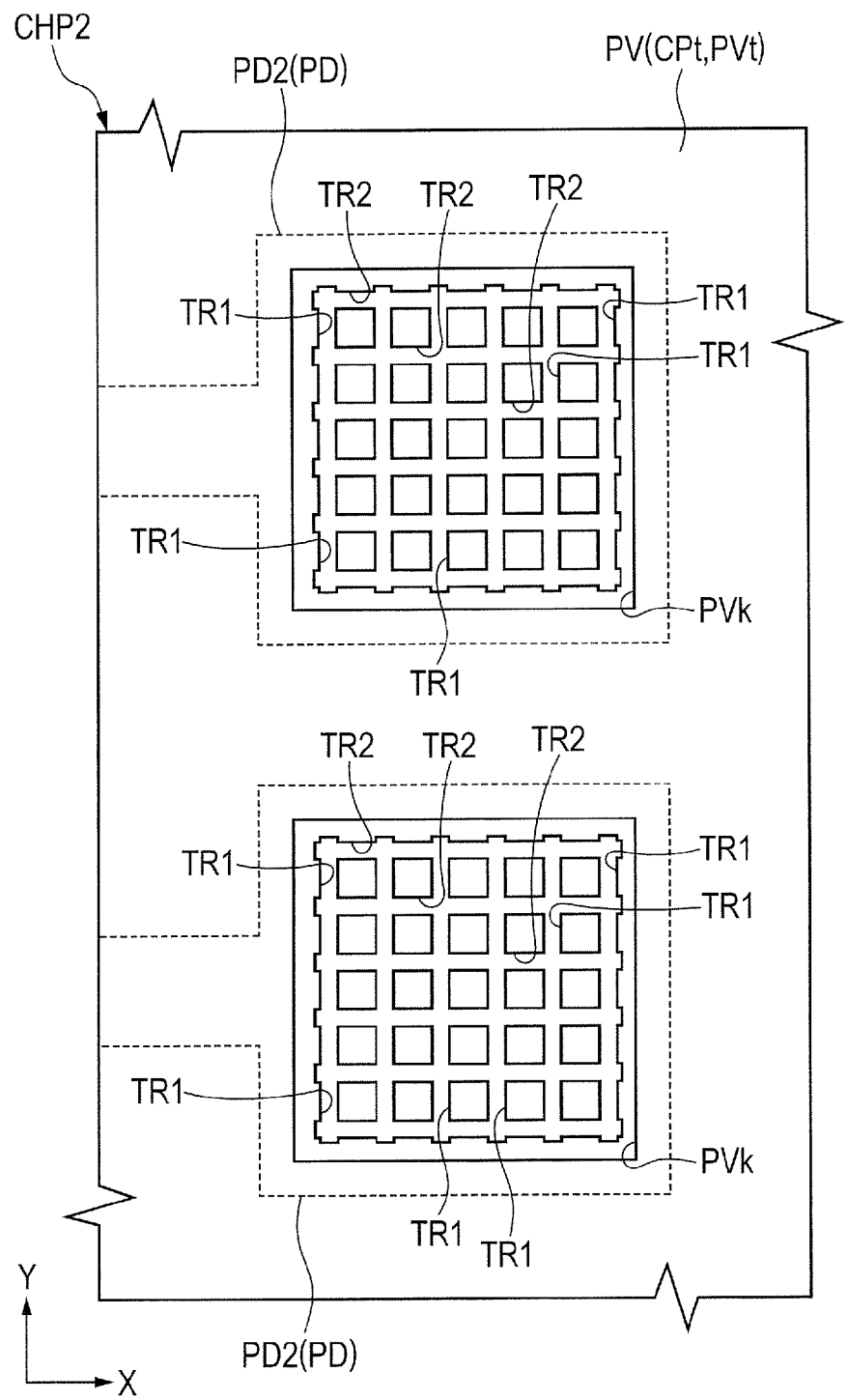
FIG. 31 is an enlarged plan view showing a variation of the example shown in FIG. 13.

The above embodiment has been described on the assumption that a plurality of strip-shaped trenches TR1 extending in the direction perpendicular to the direction of oscillation of ultrasonic waves US1 are made in the exposed area of the pad PD in order to suppress the spread of splash SPP. However, the trenches to be made in the pad PD may take any of the other various forms. FIG. 30 is an enlarged plan view showing a variation of the example shown in FIG. 8. FIG. 31 is an enlarged plan view showing a variation of the example shown in FIG. 13.

The semiconductor chip CHP2 shown in FIG. 30 as a variation is different from the semiconductor chip CHP shown in FIG. 8 in the form of the openings (trenches) formed in the exposed area of the pad PD. Specifically, each pad PD of the semiconductor chip CHP2 has a plurality of trenches TR1 extending in the Y direction perpendicular to the direction of oscillation of ultrasonic waves US1 (FIG. 12) and a plurality of trenches TR2 crossing the trenches TR1. In other words, in the pad PD, a plurality of trenches TR1 and TR2 are arranged in a grid pattern.

The trenches TR1 and trenches TR2 made in the pad PD of the semiconductor chip CHP2 may be considered as a single trench because they cross each other. If so considered, the trench made may be described as follows: the trench made in the pad PD of the semiconductor chip CHP2 includes a plurality of first portions (which correspond to the trenches 1) extending in the Y direction crossing (in FIG. 13, perpendicular to) the X direction as the direction of oscillation of ultrasonic waves US1 (FIG. 12) and a plurality of second portions (which correspond to the trenches TR2) crossing the first portions.

As described earlier in connection with the above embodiment, the direction of oscillation of ultrasonic waves US1 (FIG. 12) depends on the direction in which the horn USH (FIG. 12) of the wire bonding device WBD (FIG. 12) used at the wire bonding step extends. Therefore, the direction of oscillation of ultrasonic waves US1 may be the Y direction, depending on the orientation of the mounted semiconductor chip CHP2. However, when the trenches TR1 and TR2 are arranged in a grid pattern as in this variation, the spread of splash SPP (FIG. 10) is suppressed regardless of the orientation of the mounted semiconductor chip CHP2.

When the semiconductor chip CHP shown in FIG. 18 is mounted over the wiring substrate MDS at the die bonding step (FIG. 16), it should be mounted so that a pad PD and a bonding lead BL to be connected with each other face to each other. For this reason, the orientation of the semiconductor chip CHP is controlled as originally designed. Therefore, if the semiconductor chip CHP is intended for exclusive use in a given type of product, the trenches TR1 in the above embodiment can be structurally simpler.

However, for the purpose of increasing the versatility of the semiconductor chip CHP, it is more desirable that the spread of splash SPP (FIG. 10) can be suppressed regardless of the orientation of the mounted semiconductor chip CHP2 as in this variation.

Furthermore, as shown in FIG. 31, in the semiconductor chip CHP2, a plurality of pads PD2 arranged along the side CPs2 (FIG. 5) also each have a plurality of trenches TR1 and TR2 arranged in a grid pattern. This further increases the versatility of the semiconductor chip CHP2.

As described earlier in connection with the above embodiment, according to a study by the present inventors, in order to prevent the splash SPP (FIG. 10) from spreading to the outside of the opening PVk, in this variation as well preferably the average thickness of the portion of the pad PD overlapping the ball portion BWb of the wire BW should be as follows. Namely, it is preferable that the average thickness of the portion of the pad PD overlapping the ball portion BWb of the wire BW be 1 μm or less. It is particularly preferable that the average thickness of the portion of the pad PD overlapping the ball portion BWb of the wire BW be 850 nm or less.

In the example shown in FIGS. 30 and 31, the width of each of the trenches TR1 and TR2 is 5 μm, the distance between adjacent trenches TR1 in the X direction is 10 μm and that in the Y direction is 5 μm, the trench depth is 750 nm, and the thickness immediately below the trench TR1 is 600 nm. In this case, regardless of the diameter of the ball portion BWb to be connected with the pad PD, the portion of the pad PD overlapping the ball portion BWb of the wire BW has an average thickness of 850 nm or less.

Figure 32:
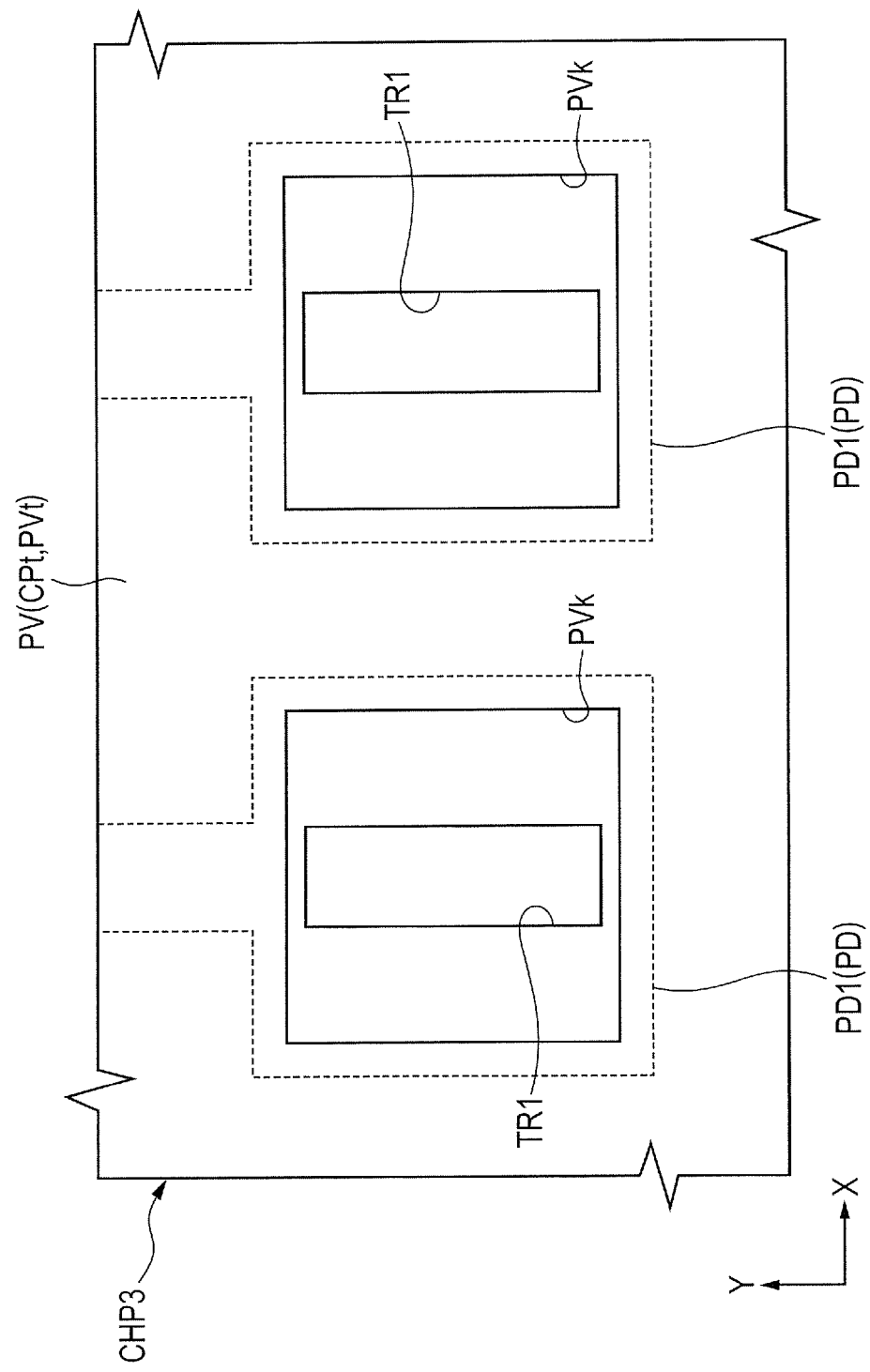
FIG. 32 is an enlarged plan view showing another variation of the example shown in FIG. 8.
Figure 33:
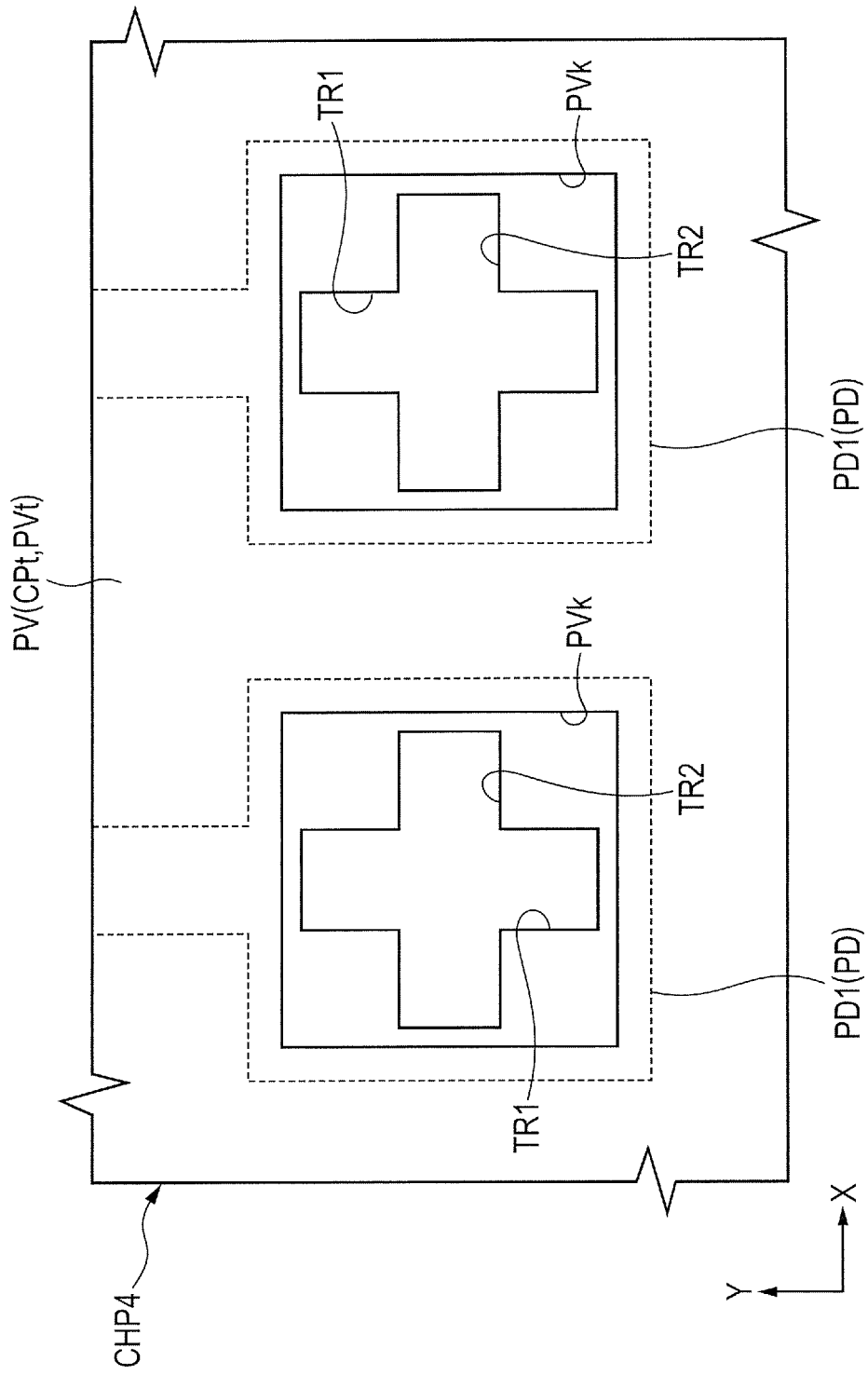
FIG. 33 is an enlarged plan view showing another variation of the example shown in FIG. 8.

Alternatively the pad may have only one wide trench TR1 like each pad PD of the semiconductor chip CHP3 shown in FIG. 32 or it may have a single trench TR1 and a single trench TR2 crossing the trench TR1 like each pad PD of the semiconductor chip CHP4 shown in FIG. 33. FIGS. 32 and 33 are enlarged plan views showing other variations of the example shown in FIG. 8.

Variation 2

The above embodiment has been described on the assumption that the wires BW shown in FIG. 3 are made of copper, silver or copper-based material covered by a palladium film. Alternatively, the wires BW may include both gold wires and wires made of copper, silver or copper-based material covered by a palladium film. In this case, trenches TR1 (FIG. 8) are not required for the pads PD to be connected with the gold wires. On the other hand, for the pads PD to be connected with the wires BW of a harder material than gold, the formation of the trenches TR1 in the above embodiment or the trenches TR1 and TR2 in the abovementioned variations is effective in suppressing the spread of splash SPP (FIG. 10).

Variation 3

The above embodiment has been described on the assumption that the semiconductor device is an area array semiconductor device in which the semiconductor chip CHP is mounted over the wiring substrate WS and the pads PD of the semiconductor chip CHP are electrically connected with the bonding leads BL as the external terminals of the semiconductor device 1 by wire bonding. However, the techniques used in the above embodiment and the above variations can also be applied to the so-called lead-frame semiconductor device in which the semiconductor chip CHP is mounted over the chip mounting area of a lead frame (not shown).

Variation 4

The above variations may be combined without departing from the scope of the technical idea of the invention as described so far in connection with the above embodiment.

The above embodiment and the above variations thereof may be combined without departing from the scope of the technical idea of the invention as described so far in connection with the above embodiment.

The technical idea of the method of manufacturing the semiconductor device according to the present invention as described so far can be described as follows.

APPENDIX 1

A semiconductor device including:
a semiconductor chip including a front surface, a protective film formed on the front surface, and a first electrode pad exposed from the protective film in an opening formed in the protective film; and
a wire with a ball portion formed at a tip, the ball portion to be bonded to the first electrode pad, in which
the ball portion is comprised of a harder material than gold;
the first electrode pad is comprised of an aluminum-based material;
a trench is formed on a portion of the first electrode pad exposed from the protective film;
a flat splash extending longitudinally in a first direction is generated around a portion of the first electrode pad which is bonded to the wire, and
the trench of the first electrode pad has first portions extending along a second direction crossing the first direction with a joint of the ball portion and the first electrode pad between them.

What is claimed is:

1. A method of manufacturing a semiconductor device comprising:
(a) providing a semiconductor chip including a front surface, a protective film formed on the front surface, and a first electrode pad exposed from the protective film in an opening formed in the protective film; and
(b) after the step (a), connecting a ball portion formed at a tip of a wire with the first electrode pad,
wherein the first electrode pad is comprised of an aluminum-based material,
wherein a trench is formed on a portion of the first electrode pad exposed from the protective film,
wherein the ball portion is comprised of a harder material than gold,
wherein the step (b) comprises the following steps:
(b1) contacting the ball portion with the first electrode pad such that the ball portion overlaps the trench of the first electrode pad,
(b2) after the step (b1), applying a load to the ball portion, and pressing the ball portion in a thickness direction of the first electrode pad, and
(b3) after the step (b2), applying ultrasonic waves to the ball portion, the ultrasonic waves oscillating in a first direction and the trench extending in a second direction perpendicular to the first direction.

2. The method of manufacturing of the semiconductor device according to claim 1,
wherein the ultrasonic waves oscillate in the first direction along the front surface of the semiconductor chip.

3. The method of manufacturing the semiconductor device according to claim 1,
wherein at the step (b3), the ultrasonic waves which oscillate in a first direction along the front surface of the semiconductor chip are applied, and
wherein the trench of the first electrode pad has a plurality of first portions extending along the second direction crossing the first direction.

4. The method of manufacturing the semiconductor device according to claim 1,
wherein a periphery of the first electrode pad is covered by the protective film in plan view.

5. The method of manufacturing the semiconductor device according to claim 4,
wherein at the step (b3), the ultrasonic waves which oscillate in a first direction along the front surface of the semiconductor chip are applied,
wherein the semiconductor chip has a plurality of electrode pads including the first electrode pad,
wherein the electrode pads are arranged along each side of the front surface in plan view,
wherein the front surface of the semiconductor chip has a first side extending along the first direction as a direction of application of the ultrasonic waves applied at the step (b3) and a second side extending in a direction crossing the first side,
wherein the electrode pads include the first electrode pads arranged along the first side and the second electrode pads arranged along the second side in plan view, and
wherein the trench is made in each of the first electrode pads and the second electrode pads.

6. A method of manufacturing a semiconductor device comprising:
(a) providing a semiconductor chip including a front surface, a protective film formed on the front surface, and a first electrode pad exposed from the protective film in an opening formed in the protective film; and
(b) after the step (a), connecting a ball portion formed at a tip of a wire with the first electrode pad,
wherein the first electrode pad is comprised of an aluminum-based material,
wherein a trench is formed on a portion of the first electrode pad exposed from the protective film,
wherein the ball portion is comprised of a harder material than gold, and
wherein the step (b) comprises the following steps:
(b1) contacting the ball portion with the first electrode pad such that the ball portion overlaps the trench of the first electrode pad,
(b2) after the step (b1), applying a load to the ball portion, and pressing the ball portion in a thickness direction of the first electrode pad, and
(b3) after the step (b2), applying ultrasonic waves to the ball portion,
wherein at the step (b3), the ultrasonic waves which oscillate in a first direction along the front surface of the semiconductor chip are applied,
wherein the semiconductor chip has the electrode pads including the first electrode pad,
wherein the electrode pads are arranged along each side of the front surface in plan view,
wherein the front surface of the semiconductor chip has a first side extending along the first direction as a direction of application of the ultrasonic waves applied at the step (b3) and a second side extending in a direction crossing the first side, wherein the electrode pads include the first electrode pads arranged along the first side and the second electrode pads arranged along the second side in plan view, and wherein the trench is made in each of the first electrode pads and not comprise in each of the second electrode pads.

7. The method of manufacturing the semiconductor device according to claim 1, wherein at the step (b3), the ultrasonic waves which oscillate in a first direction along the front surface of the semiconductor chip are applied, and wherein the trench of the first electrode pad has a first portion extending along the second direction crossing the first direction and a second portion crossing the first portion.

8. The method of manufacturing the semiconductor device according to claim 1, wherein at the step (b3), the ultrasonic waves which oscillate in a first direction along the front surface of the semiconductor chip are applied, and wherein the trench of the first electrode pad has a plurality of first portions extending along the second direction crossing the first direction and a second portion crossing each of the first portions.

9. The method of manufacturing the semiconductor device according to claim 8, wherein the semiconductor chip has the electrode pads including the first electrode pad, wherein the electrode pads are arranged along each side of the front surface in plan view, wherein the front surface of the semiconductor chip has a first side extending along the first direction as a direction of application of the ultrasonic waves applied at the step (b3) and a second side extending in a direction crossing the first side, wherein the electrode pads include the first electrode pads arranged along the first side and the second electrode pads arranged along the second side in plan view, and wherein the trench is made in each of the first electrode pads and the second electrode pads.

10. The method of manufacturing the semiconductor device according to claim 1, wherein the wire contains copper as a main component.

11. The method of manufacturing the semiconductor device according to claim 1, wherein the wire includes a base material of copper and a metal film of palladium which covers the base material.

12. The method of manufacturing the semiconductor device according to claim 1, wherein the step (b1), the step (b2), and the step (b3) are carried out continuously.

13. The method of manufacturing the semiconductor device according to claim 1, wherein the ultrasonic waves are applied while a relative positional relation in plan view between the ball portion and the first electrode pad which are in contact with each other is maintained.

14. The method of manufacturing the semiconductor device according to claim 1, wherein after the step (b1), before application of the ultrasonic waves to the ball portion, scrub operation is not performed to press and hold the ball portion against the first electrode pad and change a relative positional relation between the ball portion and the first electrode pad in plan view.

15. The method of manufacturing the semiconductor device according to claim 1, wherein at the step (b2), while the ultrasonic waves are being applied to the ball portion, the load is applied to the ball portion to press the ball portion in the thickness direction of the first electrode pad.

16. The method of manufacturing the semiconductor device according to claim 1, wherein at the step (b3), while the ultrasonic waves are being applied to the ball portion, the load is applied to the ball portion to press the ball portion in the thickness direction of the first electrode pad.

17. The method of manufacturing the semiconductor device according to claim 1, further comprising:

(c) before the step (a), providing a wiring substrate including a chip mounting surface and a mounting surface opposite to the chip mounting surface and mounting the semiconductor chip over the chip mounting surface of the wiring substrate.

18. The method of manufacturing the semiconductor device according to claim 1, wherein at the step (b), the ultrasonic waves which oscillate in a first direction along the front surface of the semiconductor chip are applied, and wherein the trenches extending along the second direction crossing the first direction are made in the first electrode pad.

19. The method of manufacturing the semiconductor device according to claim 1, wherein at the step (b), the ultrasonic waves which oscillate in a first direction along the front surface of the semiconductor chip are applied, and wherein the first trenches extending along the second direction crossing the first direction and the second trenches crossing each of the first trenches are made in the first electrode pad.

20. A method of connecting a ball portion of a bonding wire to an electrode pad of a semiconductor chip, the method comprising:

forming a plurality of trenches extending lengthwise in a first direction in a surface of the electrode pad;

contacting the ball portion with the electrode pad such that the ball portion overlaps the plurality of trenches, and an entirety of the ball portion is formed between outermost trenches of the plurality of trenches in a plan view;

applying a load to the ball portion, and pressing the ball portion in a thickness direction of the electrode pad; and applying ultrasonic waves to the ball portion, the ultrasonic waves oscillating in a second direction perpendicular to the first direction.

21. The method of claim 20, wherein the semiconductor chip includes a front surface and a protective film formed on the front surface, the electrode pad being exposed in an opening formed in the protective film.

22. The method of claim 21, wherein the electrode pad comprises an aluminum-based material, and the ball portion comprises a material having a hardness that is greater than a hardness of gold.

23. The method of claim 20, wherein a depth of the plurality of trenches in a thickness direction of the electrode pad is less than a thickness of the electrode pad, such that the electrode pad forms a bottom of the plurality of trenches.

24. The method of claim 20, wherein the applying of the ultrasonic waves to the ball portion comprises applying the ultrasonic waves to the ball portion such that a portion of the electrode pad overlaps the ball portion, an average thickness of the portion of the electrode pad overlapping the ball portion being 1 μm or less.

25. The method of claim 20, wherein the applying of the ultrasonic waves comprises:
    providing a wire bonding device comprising:
        a capillary as a pressure bonding tool;
        an oscillator for generating the ultrasonic waves; and
        an ultrasonic transmitter comprising a bar member extending in the second direction, the bar member connecting the oscillator to the capillary, and
    placing the bonding wire in the capillary; and
    generating the ultrasonic waves with the oscillator.

\* \* \* \* \*